(12) United States Patent
Saitoh et al.

(10) Patent No.: US 7,646,092 B2
(45) Date of Patent: Jan. 12, 2010

(54) SEMICONDUCTOR DEVICE AND MANUFACTURING METHOD THEREOF

(75) Inventors: Hiroshi Saitoh, Iwata (JP); Toshihisa Suzuki, Hamamatsu (JP); Shingo Sakakibara, Hamamatsu (JP)

(73) Assignee: Yamaha Corporation, Shizuoka-Ken (JP)

( * ) Notice: Subject to any disclaimer, the term of this patent is extended or adjusted under 35 U.S.C. 154(b) by 261 days.

(21) Appl. No.: 11/566,879

(22) Filed: Dec. 5, 2006

(65) Prior Publication Data
US 2007/0176272 A1 Aug. 2, 2007

(30) Foreign Application Priority Data

| Dec. 6, 2005 | (JP) | ............................ P2005-351653 |
| Dec. 6, 2005 | (JP) | ............................ P2005-351654 |
| Dec. 27, 2005 | (JP) | ............................ P2005-376393 |
| Oct. 31, 2006 | (JP) | ............................ P2006-296013 |

(51) Int. Cl.
*H01L 23/12* (2006.01)

(52) U.S. Cl. ...................... 257/704; 257/679; 257/680; 257/E23.181; 381/355; 381/360

(58) Field of Classification Search ................ 257/679, 257/680, 704, E23.181; 381/355, 360

See application file for complete search history.

(56) References Cited

U.S. PATENT DOCUMENTS

| 6,225,694 | B1 * | 5/2001 | Terui ........................... 257/704 |
| 6,781,231 | B2 | 8/2004 | Minervini | |
| 7,084,376 | B2 * | 8/2006 | Ito et al. ................... 219/444.1 |
| 7,121,925 | B2 * | 10/2006 | Hashimura et al. ............ 451/29 |
| 7,298,030 | B2 * | 11/2007 | McWilliams et al. ........ 257/680 |

FOREIGN PATENT DOCUMENTS

| CN | 1420557 A | 5/2003 |
| JP | 09-022954 | 1/1997 |
| JP | 2004-537182 A | 12/2004 |
| WO | WO-02/45463 A2 | 6/2002 |

* cited by examiner

*Primary Examiner*—Davienne Monbleau
*Assistant Examiner*—Hajar Kolahdouzan
(74) *Attorney, Agent, or Firm*—Dickstein Shapiro LLP

(57) ABSTRACT

A semiconductor device of the invention includes: a substrate having a hollowed hollow section on a top surface; a semiconductor chip mounted in the hollow section of the substrate; and a lid having a substantially plate-shaped top plate section that opposes the substrate and covers the hollow section, and having at least one pair of side wall sections that project from a circumference of the top plate section towards the substrate and that engage with a side surface of the substrate. The substrate and the lid can be accurately positioned.

11 Claims, 29 Drawing Sheets

SEMICONDUCTOR DEVICE AND MANUFACTURING METHOD THEREOF

BACKGROUND OF THE INVENTION

1. Field of the Invention

The present invention relates to a semiconductor device provided with a semiconductor chip such as a sound pressure sensor chip and a pressure sensor chip.

Priority is claimed on Japanese Patent Applications No. 2005-351653 and No. 2005-351654 filed on Dec. 6, 2005, Japanese Patent Application No. 2005-376393 filed on Dec. 27, 2005, and Japanese Patent Application No. 2006-296013 filed on Oct. 31, 2006, the contents of which are incorporated herein by reference.

2. Description of Related Art

As disclosed in Published Japanese Translation No 2004-537182 of the PCT International Publication and U.S. Pat. No. 6,781,231, in a conventional semiconductor device such as a silicon microphone or a pressure sensor, a semiconductor chip, which has a movable part such as a sound pressure sensor chip or a pressure sensor chip, is mounted on the top surface of a substrate. In a semiconductor device of this kind, the top surface of a circuit substrate on which a semiconductor chip is mounted is covered by a metallic cover (lid) that forms a hollow space that encloses the semiconductor chip. An aperture section is formed in this cover to communicate the above hollow space with an outer space. This cover is fixed on the circuit substrate by adhering an end section of the cover to the top surface of the substrate via a conductive adhesive agent.

However, since it is necessary to adhere and fix the cover to the top surface of the circuit substrate in the manufacturing of the above conventional semiconductor device, it is difficult to position of the cover with respect to the circuit substrate.

Moreover, for this kind of semiconductor device, it is demanded to improve the manufacturing efficiency, and reduce the manufacturing cost of the semiconductor device.

SUMMARY OF THE INVENTION

In consideration of the situation described above, an object of the present invention is to provide a semiconductor device in which the lid can be easily positioned with respect to the substrate, and a lid to be used for this semiconductor device.

Furthermore, another object of the present invention is to improve the manufacturing efficiency of the semiconductor device while achieving a reduction in manufacturing cost of the semiconductor device.

In order to solve the above problem, a semiconductor device of the present invention is provided with; a substrate having a hollowed hollow section on a top surface; a semiconductor chip mounted in the hollow section of the substrate; and a lid having a substantially plate-shaped top plate section that opposes the substrate and covers the hollow section, and having at least one pair of side wall sections that project from a circumference of the top plate section towards the substrate and that engage with a side surface of the substrate.

Moreover a manufacturing method for a semiconductor device according to the present invention for manufacturing a semiconductor device in which a semiconductor chip mounted on one face in the thickness direction of a substrate, is covered by a conducting lid via a hollowed hollow section, comprises: a substrate plate member preparation step for forming a cutout for dividing a substrate plate on which a large number of the semiconductor chips are arranged in line on the one face in the thickness direction, into individual substrates; a lid preparation step for forming a large number of lids which individually cover the large number of semiconductor chips, positioned on one face of the substrate plate; an alignment step for overlapping and fixing the large number of lids on the one face side of each of the substrate plates so that the large number of lids cover each of the large number of semiconductor chips; and a dividing step for breaking the substrate plates from the cutout, and dividing into individual semiconductor devices According to the semiconductor device of the present invention, by having a pair of side wall sections engaged with the side surfaces of the substrate, the top plate section can be easily positioned with respect to the substrate, that is, the lid can be easily positioned with respect to the substrate.

Moreover in the manufacturing method for a semiconductor device according to the present invention, since the cutout is formed in the substrate plate member preparation step, then in the dividing step, by simply bending the substrate plate member and producing a shear force in the remaining portion of the cutout, the remaining portion of the cutout can be easily broken. Moreover, in the overlapping step since the large number of lids are overlapped and fixed to the one side face of the respective substrate plate members, individual semiconductor devices can be obtained at the same time as dividing the substrate plate members into individual substrates. In this dividing step, it is not necessary to divide using dicing where the fracture portion is cooled with water. Therefore even if an aperture portion is formed in the lids, and the hollow space portion arranged in the substrate chip is communicated with the outside, there is no occurrence of an undesirable situation where the water ingresses to inside the hollow space from the opening portion.

DETAILED DESCRIPTION OF THE INVENTION

Next, a first embodiment of a semiconductor device of the present invention is described, with reference to the drawings.

Figure 1:
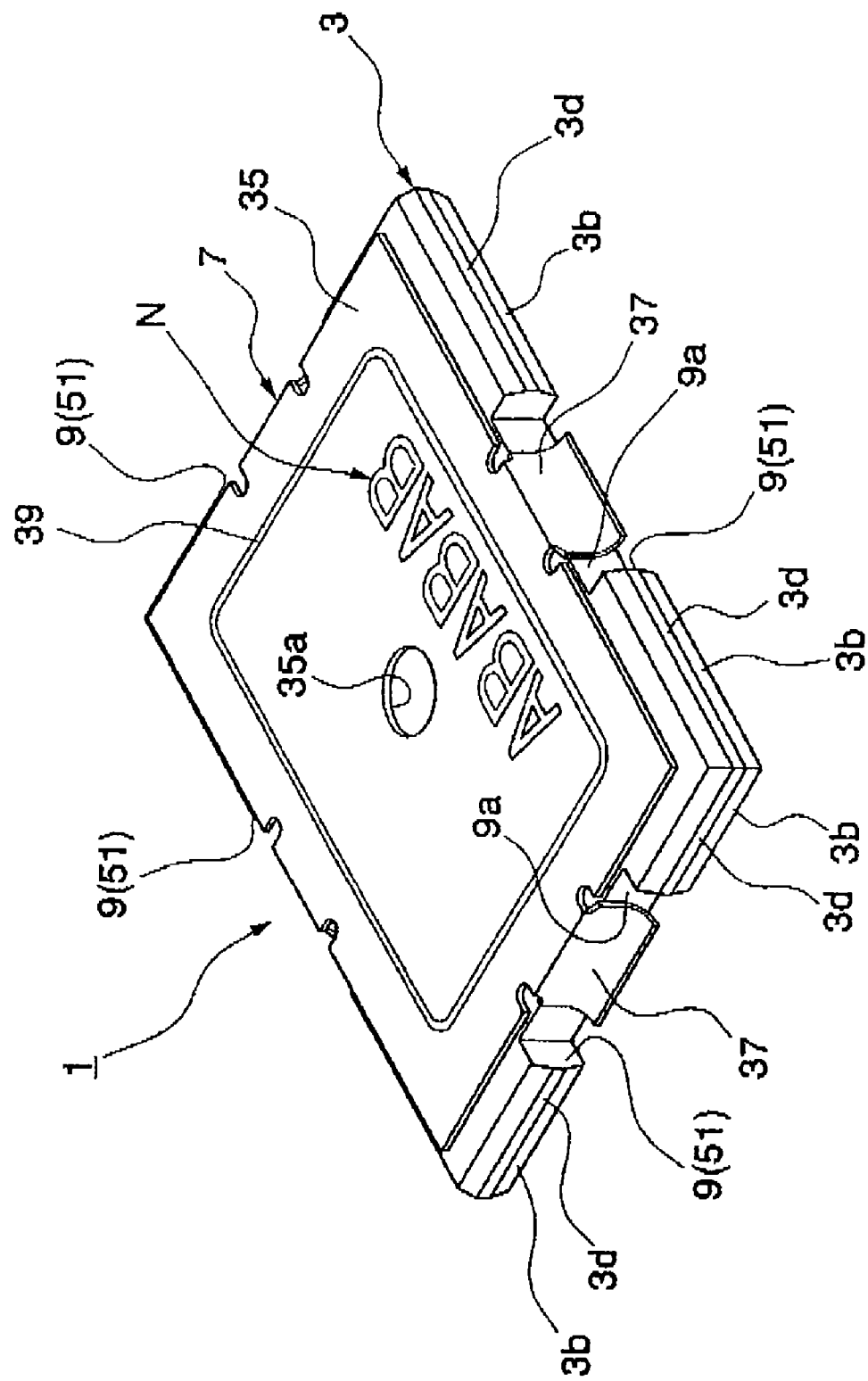
FIG. 1 is a perspective view that shows a semiconductor device according to a first embodiment of the present invention, seen from a lid side.
Figure 2:
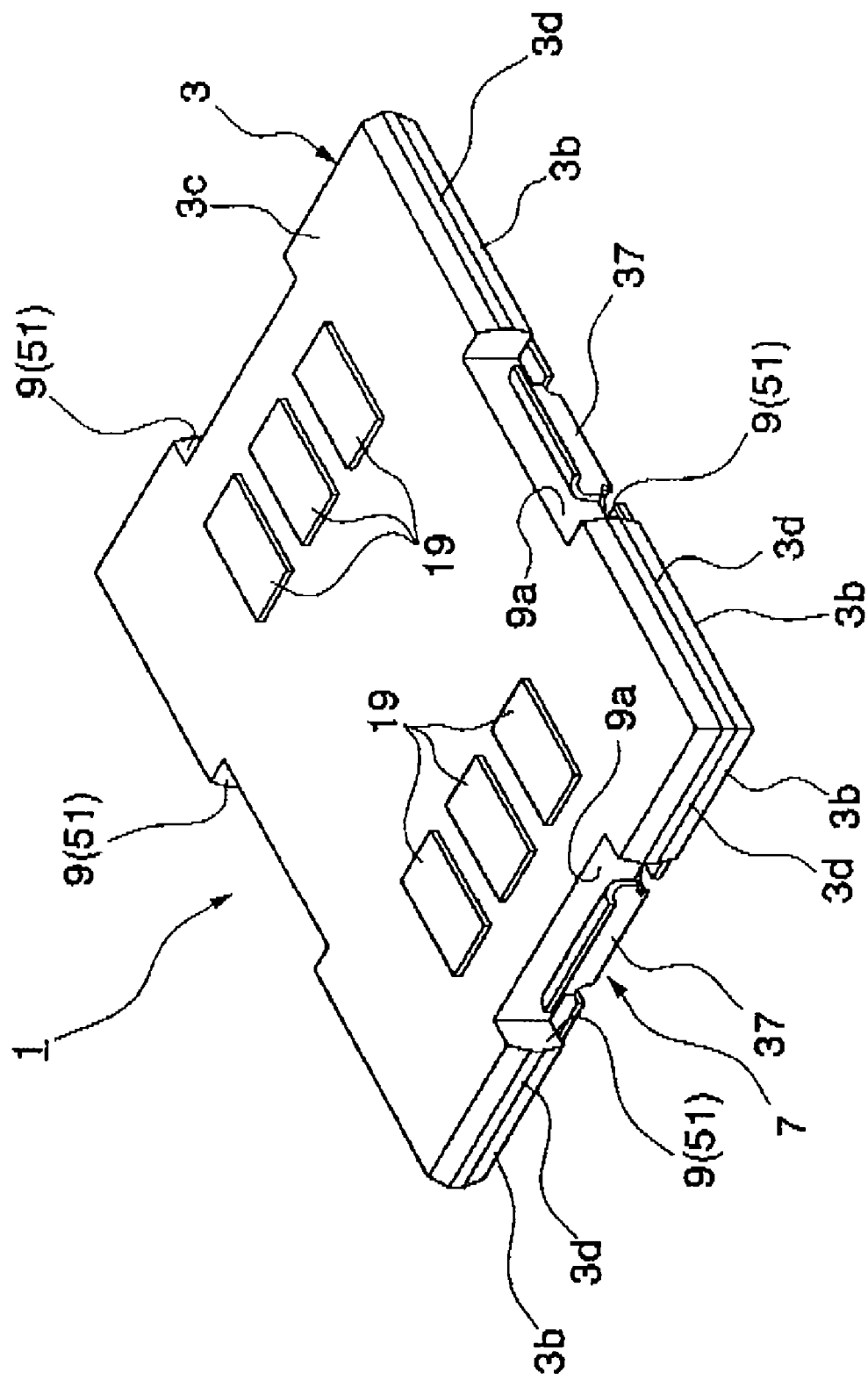
FIG. 2 is a perspective view that shows the semiconductor device in FIG. 1 seen from a ceramic substrate side.
Figure 3:
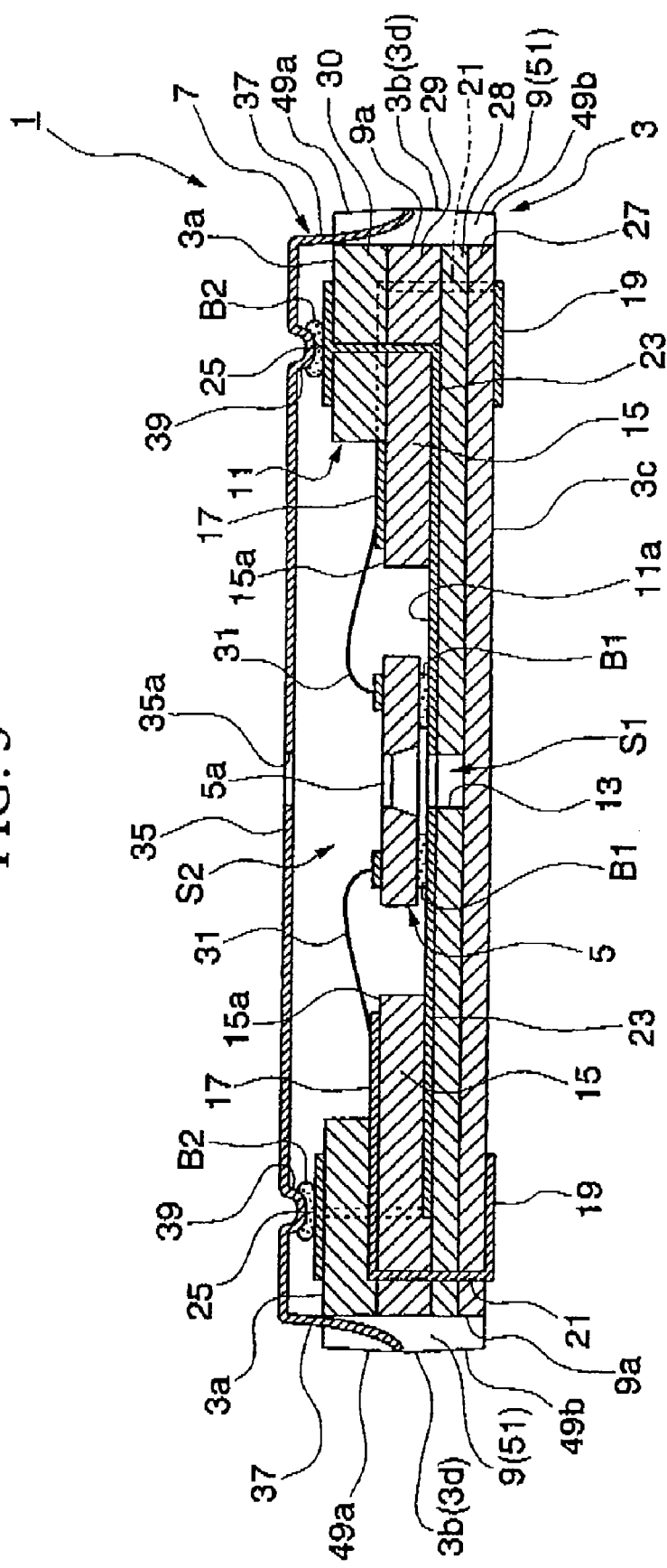
FIG. 3 is a sectional view that shows the semiconductor device in FIG. 1.

As shown in FIG. 1 to FIG. 3, a semiconductor device 1 according to this embodiment is provided with: a ceramic substrate 3 formed in a substantially plate shape; and a semiconductor chip 5 and a lid 7 arranged and overlapped on a top surface 3a side of the ceramic substrate 3.

The ceramic substrate 3 is a plate of a substantially rectangular shape in a plan view, a center section of each side surface 3b thereof being recessed, with a cutaway 9 formed extending from the top surface 3a to a reverse surface 3c of the ceramic substrate 3. As can be seen in FIG. 3, a concave section 11 recessed from the top surface 3a is formed in the ceramic substrate 3. A hole 13 having a closed end is formed in a substantially center section of a bottom surface 11a of this concave section 11. A step section 15 is formed by lamination on a circumference of the bottom surface 11a, and this step section forms a stair shape between the top surface 3a of the ceramic substrate 3 and the bottom surface 11a of the concave section 11.

A plurality of pad electrodes 17 for electrically connecting the semiconductor chip 5 are formed on a top surface 15a of the step section 15. A plurality of external connection terminals 19 are formed on a reverse surface 3c of the ceramic substrate 3. These pad electrodes 17 and external connection terminals 19 are electrically connected by a wiring section 21 formed within the ceramic substrate 3.

A shield member 23 having conducting properties is provided in the ceramic substrate 3. This shield member 23 is laminated on the entire bottom surface 11a of the concave section 11. A substantially annular shaped connection pad 25 is formed on the top surface 3a of the ceramic substrate 3 around the circumference of an aperture section of the concave section 11, and it is electrically connected to the shield member 23. One portion of this shield member 23 forms the bottom surface 11a of the concave section 11.

The pad electrodes 17, external connection terminals 19, wiring section 21, shield member 23, and connection pad 25 described above are formed using paste principally compounded of silver powder, copper powder or tungsten powder (a mixture of silver powder, copper powder, or tungsten powder with a binder such as acrylic resin). The pad electrodes 17, external connection terminals 19, and connection pad 25 are formed by plating the above mentioned materials with nickel (Ni) of thickness 1 μm or more and gold (Au) of thickness 0.3 μm. These pad electrodes 17, external connection terminals 19 and wiring section 21, and shield member 23 and connection pad 25 are electrically insulated.

This ceramic substrate 3 is formed, as shown in FIG. 3, by laminating a plurality of insulating layers 27, 28, 29, and 30 formed by baking ceramic green sheet. The above mentioned pad electrodes 17, external connection terminals 19, wiring section 21, shield member 23, and connection pad 25 are formed on each of the insulating layers 27, 28, 29, and 30. That is to say, the concave section 11, step section 15, and hole 13 formed in the ceramic substrate 3 are formed by punching them out from the ceramic green sheet.

The semiconductor chip 5 is a sound pressure sensor chip (microphone) that converts an acoustic signal into an electric signal. That is to say, this semiconductor chip 5 is provided with a diaphragm 5a that oscillates in response to pressure variation of acoustic signals or the like from the space outside the semiconductor device 1. The diaphragm 5a is configured so as to oscillate in a thickness direction of the semiconductor chip 5

This semiconductor chip 5 is adhered via an adhesive paste B1 composed of insulating materials, and fixed on the bottom surface 11a of the concave section 11 so as to cover the hole 13. The semiconductor chip 5 is electrically connected to the pad electrodes 17 by wires 31. The concave section 11 formed in the ceramic substrate 3 maintains a hollow section S1 large enough to allow the diaphragm 5a to oscillate sufficiently between the diaphragm 5a of the semiconductor chip 5 and the hole 13 of the ceramic substrate 3.

The lid 7 is formed from a material having conducting properties, for example nickel silver (Cu—Ni—Zn alloy), plated copper, plated 42 alloy (Fe-42 wt % Ni alloy) or the like. For the plating, for example nickel plating, chrome plating, or gold plating is used.

The lid 7 is provided with a top plate section 35 and a plurality of side wall sections 37. The top plate section 35 is of a substantially rectangle shape and covers the top surface 3a of the ceramic substrate 3 and the aperture of the concave section 11, forming a hollow space (hollow section) S2 that includes the semiconductor chip 5. The side wall sections 37 project from the circumference of the top plate section 35 and engage with the cutaways 9 of the side surfaces 3b of the ceramic substrate 3.

Figure 6:
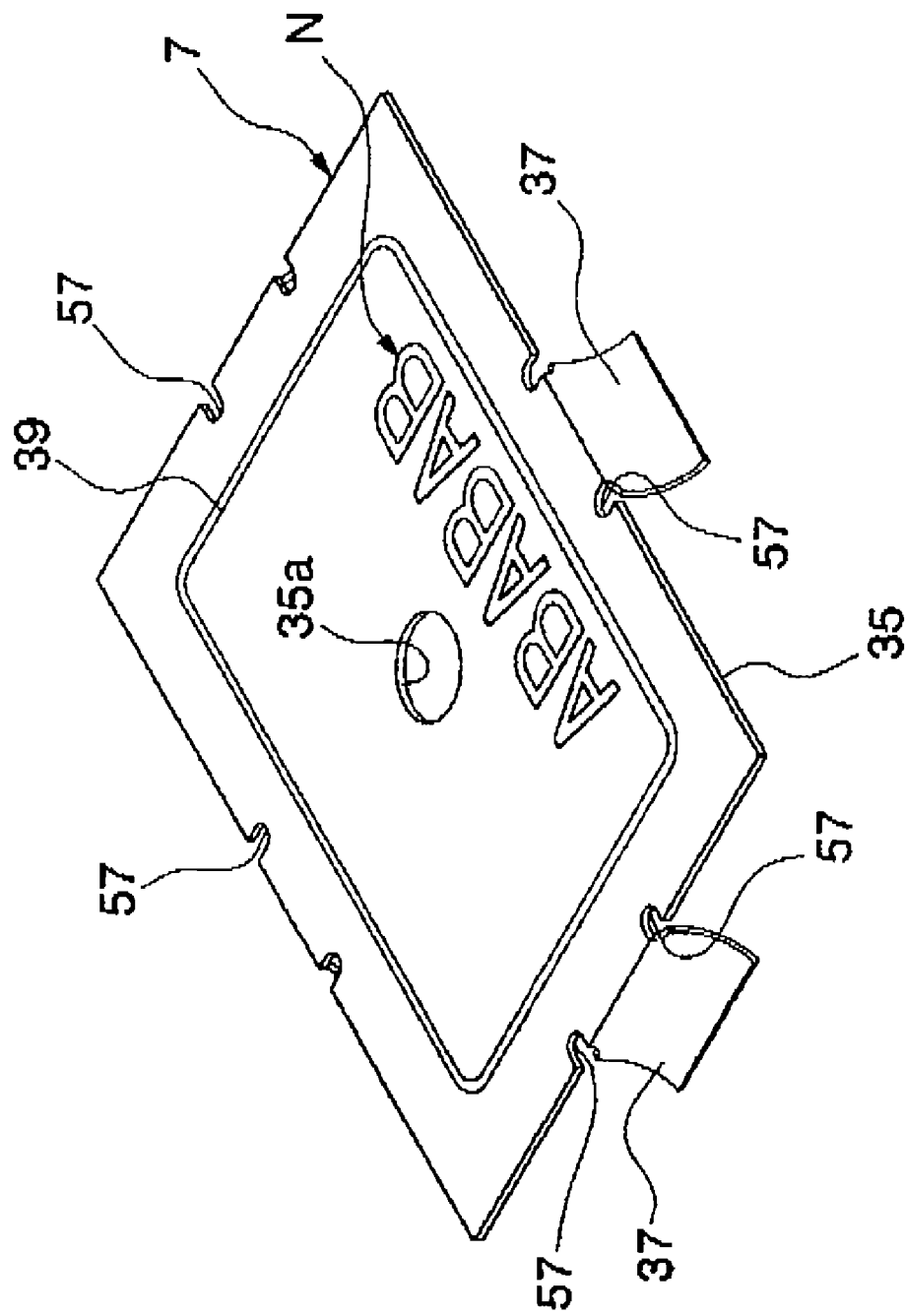
FIG. 6 is a perspective view that shows a lid used in a first manufacturing method of the semiconductor device according to the first embodiment of the present invention.

As shown in FIG. 6, in the top plate section 35, a substantially annular shaped projection section 39 is formed in a position opposing to the circumference of the concave section 11 of the ceramic substrate 3 so as to project towards the top surface 3a of the ceramic substrate 3. Since this projection section 39 is formed by deforming the top plate section 35, the rigidity of the lid 7 is improved to prevent deflection of the top plate section 35.

In a state where the top plate section 35 is arranged on the top surface 3a of the ceramic substrate 3, this projection section 39 is electrically connected to the connection pad 25. Specifically, the projection section 39 and the connection pad 25 are adhered and fixed to each other by the conductive paste B2 that has conductive properties. As a result, the lid 7 is fixed on the ceramic substrate 3. Moreover, the lid 7 and the shield member 23 surround the semiconductor chip 5, and the shield member 23 of the ceramic substrate 3 and the lid 7 are electrically connected to each other.

An aperture section 35a is formed in the top plate section 35 so as to pass through in the thickness direction thereof. This aperture section 35a communicates between the hollow space S2 that includes the semiconductor chip 5, and the outer space outside the semiconductor device 1.

The side wall sections 37 of the lid 7 respectively project from each of the four sides of the top plate section 35. Pairs of side wall sections 37 provided on two opposing sides of the top plate section 35 oppose each other. The plurality of the side wall sections 37 respectively engage with a plurality of the cutaways 9 formed in the side surface 3b of the ceramic substrate 3. That is to say, the side wall sections 37 press against and contact with side surfaces 9a of each of the cutaways 9.

Next, a first manufacturing method of the semiconductor device 1 of the first embodiment according to the present invention configured as described above is described.

Figure 4:
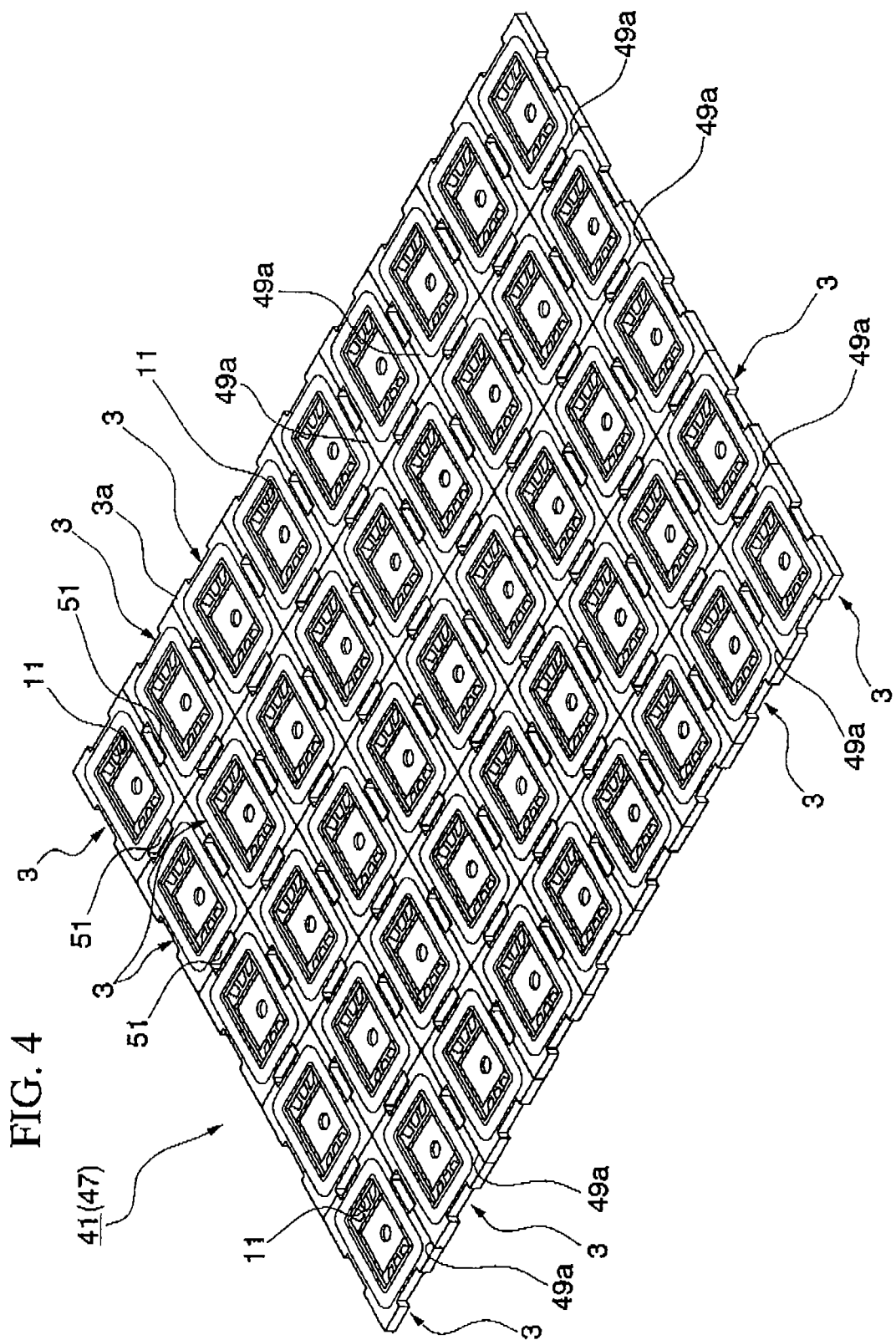
FIG. 4 is a perspective view that shows a substrate plate member used in a manufacturing method of the semiconductor device according to the first embodiment of the present invention.
Figure 5:
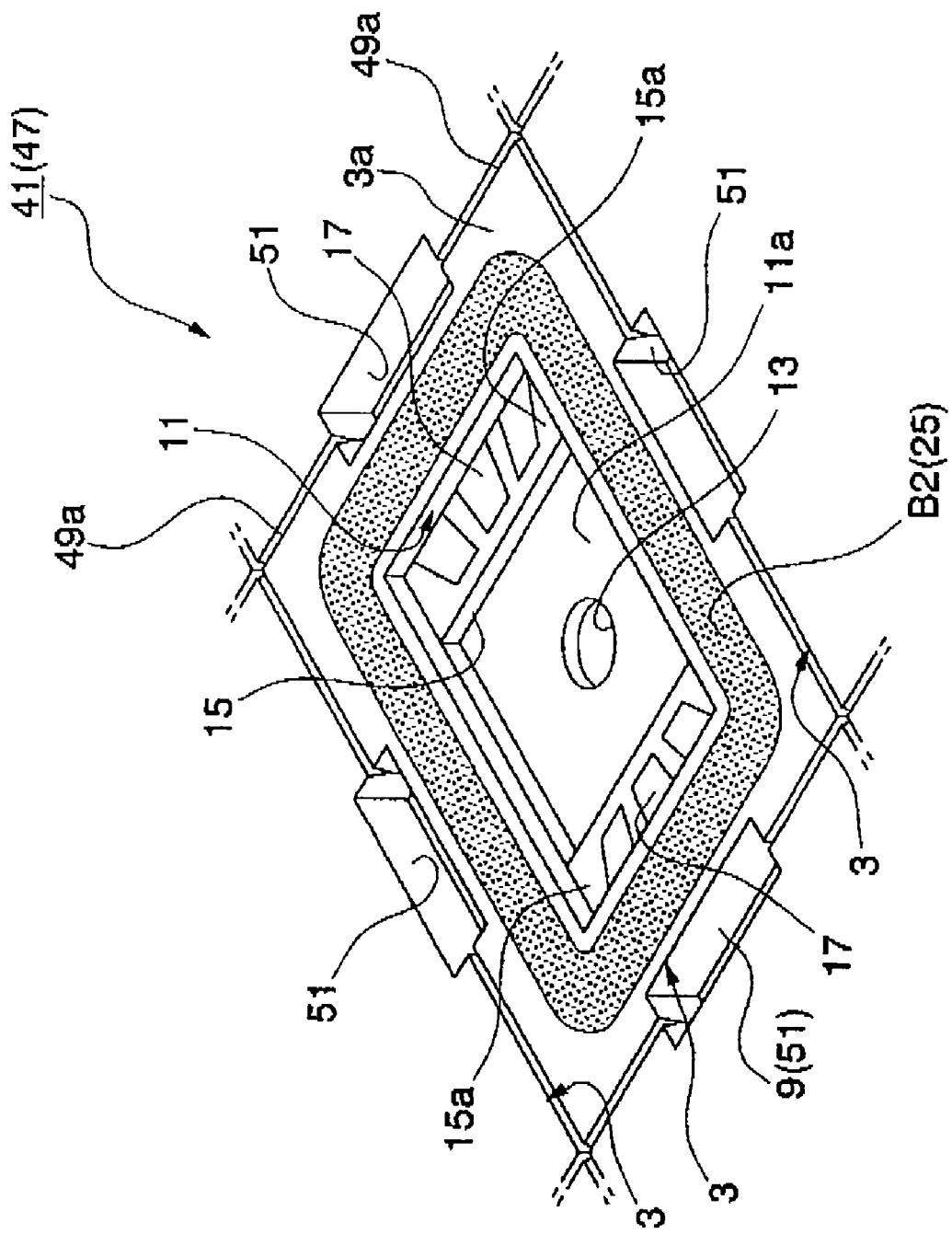
FIG. 5 is a perspective view that shows a partial enlargement of the substrate plate member shown in FIG. 4.
Figure 7:
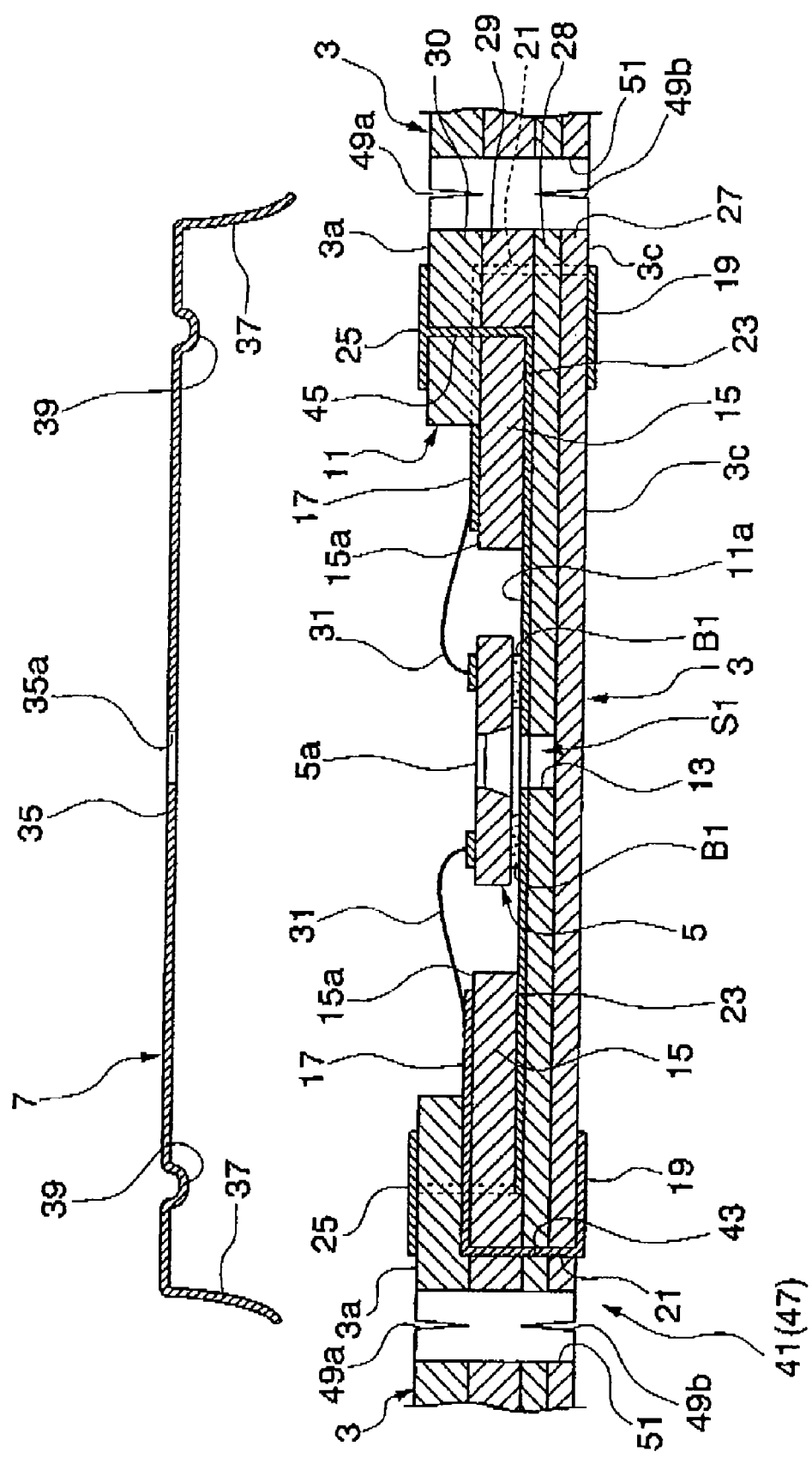
FIG. 7 is a sectional side view that shows the first manufacturing method of the semiconductor device according to the first embodiment of the present invention.

In this manufacturing method, first, as shown in FIG. 4, FIG. 5, and FIG. 7, a substrate plate member 41 on which a number of semiconductor chips 5 can be arranged is prepared (substrate plate member preparation step). This substrate plate member 41 is a number of the ceramic substrates 3 connected in a matrix.

In this substrate plate member preparation step, to begin, four green sheets formed into a sheet form from ceramic paste containing ceramic powder are prepared. These green sheets constitute the respective insulating layers 27, 23, 29, and 30 of the ceramic substrate 3.

Next, each of the green sheets are subjected to a punching process to form window holes for forming the concave section 11, hole 13 and step section 15 of the respective ceramic substrates 3, as well as through holes 43 and 45 used for forming the wiring section 21 and shield member 23. Subsequently, paste compounded principally of silver powder, copper powder or tungsten powder is appropriately printed onto a top surface and reverse surface of the respective green sheets by means of screen printing. Furthermore, the pad electrodes 17, external connection terminals 19, wiring section 21, shield member 23, and connection pad 25 are formed by filling the above paste into the through holes 43 and 45 of the respective green sheets.

Next as shown in FIG. 4 and FIG. 5, these four green sheets are laminated to construct a green sheet laminated body 47. Cuts 49a and 49b are formed on the top surface and reverse surface of this green sheet laminated body 47. These cuts 49a and 49b separate individual ceramic substrates 3 and are formed in grid. Furthermore, insert holes 51 passing through in the thickness direction of the green sheet laminated body 47 are formed in one part of the cuts 49a and 49b, positioned between adjacent ceramic substrates 3. These insert holes 51 are formed substantially in the center between respective intersections of the cuts 49a and 49b formed in a grid. Moreover, these cuts 49a and 49b and the insert hole 51 may be formed either simultaneously or formed respectively separately.

Subsequently, this green sheet laminated body 47 is baked at 1000° C. or more, and nickel or gold plating is applied to the pad electrode 17, the external connection terminal 19 and the connection pad 25 to complete the manufacturing of the substrate plate member 41.

An example of forming the cuts 49a and 49b of the substrate plate member 41 on the top surface 3a and reverse surface 3c of the substrate plate member 41 has been described. However, it is not limited to this and the cuts 49a and 49b may be formed only on the top surface 3a or reverse surface 3c of the substrate plate member 41.

Furthermore, an example of forming the ceramic substrate 3 and substrate plate member 41 for constructing the semiconductor device 1 and a semiconductor unit 65 (described later) from the paste containing ceramic powder has been described. However, it is not limited to this, and they need only be formed from material that allows the remaining sections of the cuts 49a and 49b to be easily broken apart. In other words, the ceramic substrate 3 and the substrate plate member 41 may be formed from an organic substrate containing glass fabrics for example.

In this first manufacturing method, a number of the lids 7 are formed as a separate step from the above substrate plate member preparation step (lid preparation step).

As shown in FIG. 6 and FIG. 7, in this lid preparation step, a plate member having conducting properties, such as a copper material or a 42 alloy, that has been plated with nickel, chrome or gold, or a plate member of nickel silver is prepared. A punching process is carried out on this plate member to form the top plate section 35 and plate shaped extension sections that integrally extend from the respective sides of the top plate section 35.

Cutaway holes 57 are formed at the boarders between the top plate section 35 and the respective extension sections so that the respective extension sections can be easily bent with respect to the top plate section 35. In this lid preparation step, the respective extension sections are bent with respect to the top plate section 35 to form the side wall sections 37 that project in the thickness direction of the top late section 35 At the time of carrying out this bending process, a process for bending the extension sections in a direction such that the tip ends of the respective side wall sections 37 tend away from the side wall section 37 on the opposite side is also carried out.

An example of providing two pairs of the side wall sections 37 on four sides of the top plate section 35 has been described, however, it is not limited to this, and they need only be formed on at least one of the pairs of sides of the top plate section 35.

In this lid preparation step, a punching process similar to that described above is carried out to form the aperture section 35a in the top plate section 35. Furthermore, in this lid preparation step, the top plate section 35 is deformed by means of a coining process to form the substantially annular shaped projection section 39 that projects in the same direction as that of the side wall section 37.

Moreover, in this lid preparation step, the punching process for forming the top plate section 35, the extension section, and the aperture section 35a, the bending process for forming the side wall section 37, and the coining process for forming the projection section 39 may be carried out simultaneously or separately.

Having completed the above described substrate plate member preparation step, the adhesive paste B1 compounded of insulating materials is applied to the bottom surface 11a of the respective concave sections 11, and a chip arrangement step, in which the semiconductor chips 5 are arranged side by side, is carried out. In this chip arrangement step, after the respective semiconductor chips 5 have been loaded, paste curing is performed to thermoset the adhesive paste B1. In this paste curing, heat is applied constantly at 150° C. for approximately one hour. Having completed this chip arrangement step, a connection step for electrically connecting the semiconductor chip 5 and the pad electrodes 17 by the wires 31 is carried out by means of wire bonding, and a visual examination is carried out to confirm correction connection of the wires 31.

Furthermore, these chip arrangement step and connection step are carried out prior to an overlapping step described later, and may be carried out in parallel with the lid preparation step described above.

Figure 8:
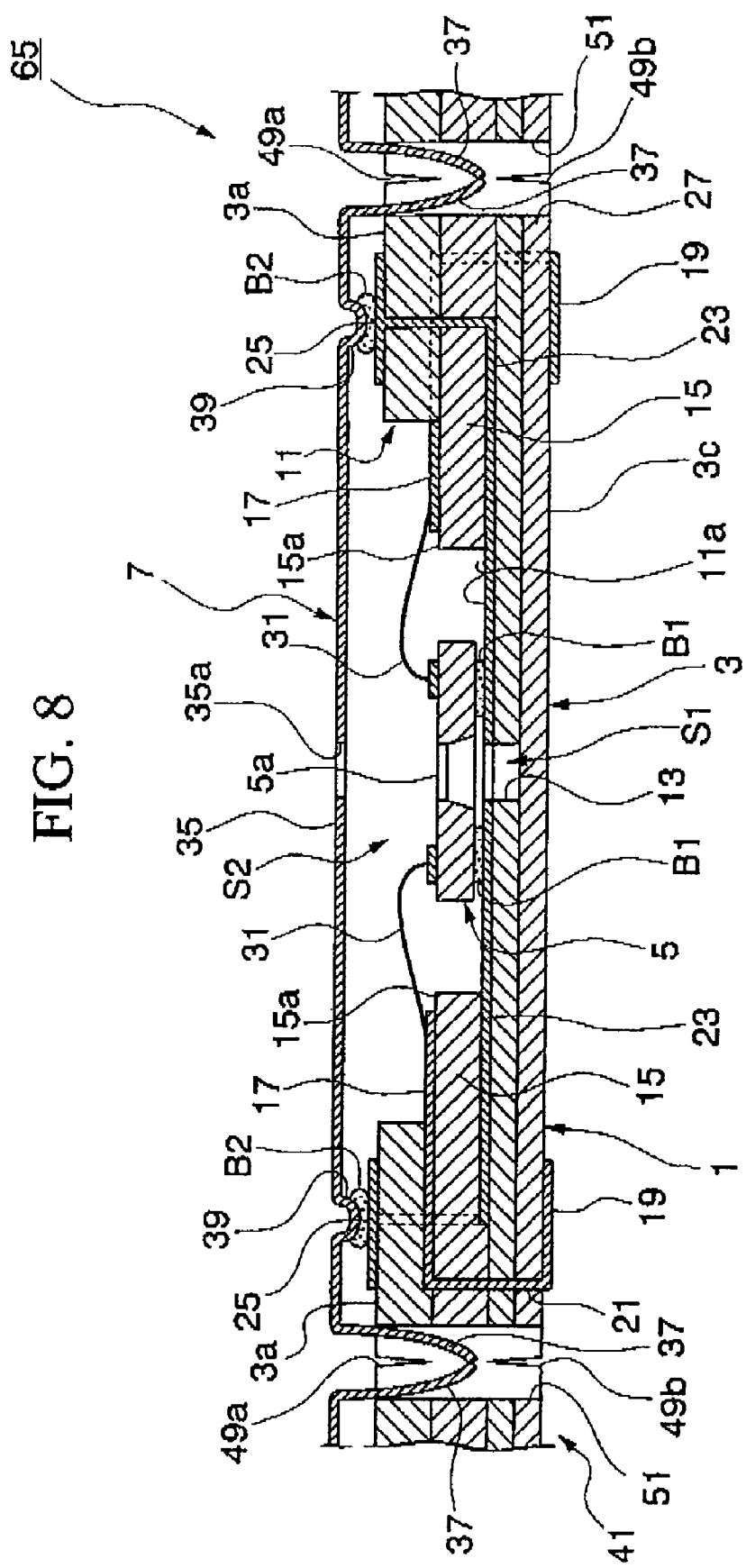
FIG. 8 is a sectional side view that shows the first manufacturing method of the semiconductor device according to the first embodiment of the present invention.

Having completed the above described step, the conductive paste B2 is printed onto the connection pad 25 as shown in FIG. 8. Thereafter, a number of the lids 7 are overlapped and fixed onto the top surface 3a of the substrate plate member 41, so as to individually cover the corresponding semiconductor chips 5 (overlapping step).

At this time, the side wall sections 37 of the respective lids 7 are respectively inserted into the corresponding insert holes 51 of the substrate plate member 41. Thus, the respective lids 7 can be easily positioned with respect to a number of the semiconductor chips 5. Since the tip ends of the opposing side wall sections 37 are bent so as to be away from each other, the side wall sections 37 can be easily guided into the insert holes 51 during insertion. Moreover, in this overlapping step, since the projection section 39 of the respective top plate section 35 is brought into contact with the above conductive paste B2, the lid 7 and the shield member 23 are electrically connected to each other.

Figure 9:
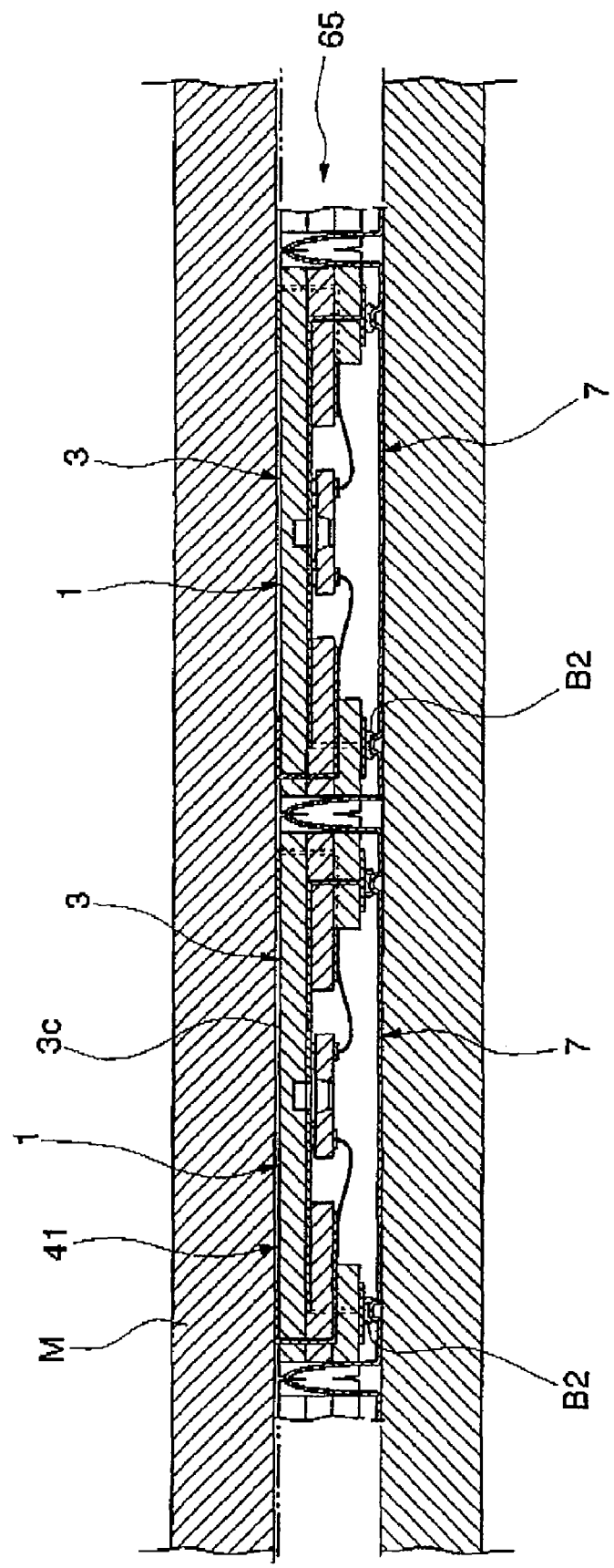
FIG. 9 is a sectional side view that shows the manufacturing method of the semiconductor device according to the present invention.

After the number of lids 7 have been overlapped on the top surface 3a of the substrate plate member 41 and the projection sections 39 have been brought in contact with the conductive paste B2, the number of lids 7 and the substrate plate member 41 are flipped over and a metal weight M is loaded onto the reverse surface 3c of the substrate plate member 41 as shown in FIG. 9. In this state, conductive paste curing, in which heat is applied constantly at 150° C. for approximately one hour, is carried out to harden the conductive paste B2. As a result, the number of the lids 7 are fixed onto the substrate plate member 41, completing the overlapping step.

By completing this overlapping step, a semiconductor unit 65, comprising a number of semiconductor devices 1 integrally joined, is constructed.

Subsequently, a name for identifying the semiconductor device 1 or an identification symbol N such as a serial number (refer to FIG. 1) is printed on the top surface of the respective lids 7. Next, the substrate plate member 41 is broken apart at the cuts 49a and 49b to divide it into individual semiconductor devices 1 (dividing step).

Figure 10:
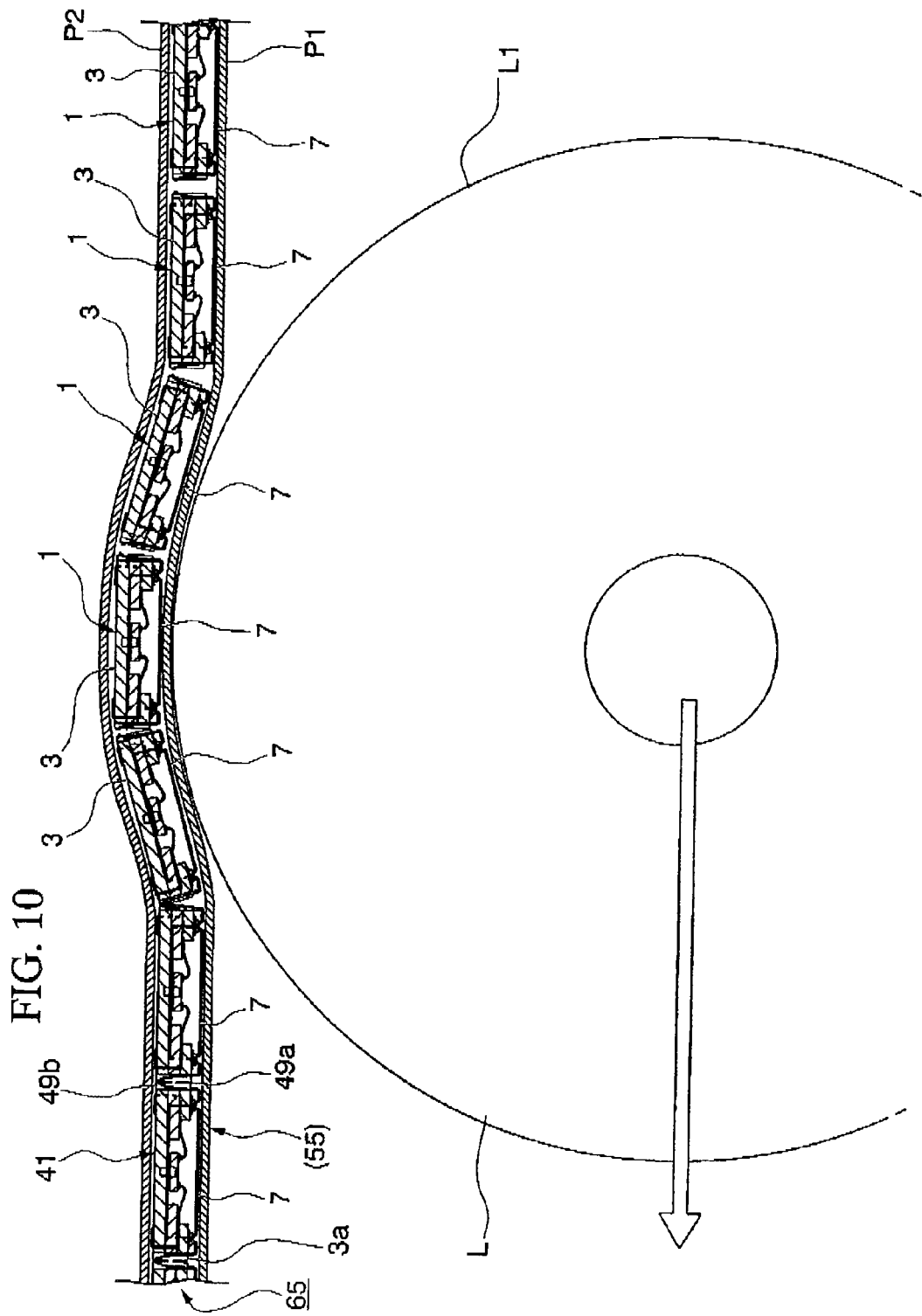
FIG. 10 is a sectional side view that shows a dividing step in the manufacturing method of the semiconductor device according to the present invention.

In this dividing step, as shown in FIG. 10, a circumference surface L1 of a roller L formed in a substantially column shape is pressed from the underside against the top surface 3a side of the substrate plate member 41, and the roller L is moved in the direction along the top surface 3a of the substrate plate member 41. As a result, since the substrate plate member 41 is bent along the shape of the circumference surface L1 of the roller L, the remaining sections of the cuts 49a and 49b are broken apart simultaneously, dividing the substrate plate member 41 into the individual ceramic substrates 3. Accordingly, the individually divided semiconductor device 1 can be obtained.

In this dividing step, in order to achieve protection for the respective lids 7, it is preferable that a protection member P1 formed as a flexible sheet is placed between the circumference surface L1 and the lid 7. Moreover, in this dividing step, it is preferable that a holding member formed as a flexible sheet P2 is arranged on the reverse surface of the substrate plate member 41 so that the divided semiconductor devices 1 do not fly off. The protection member P1 and holding member P2 do not move with respect to the substrate plate member 41 and the respective lids 7.

In this dividing step, division does not need to be carried out by means of dicing where the cut sections are cooled by water. Therefore, a problem of water entering from the respective lids 7 into the hollow space S2 does not occur.

Furthermore, in the above dividing step, the roller L is moved with respect to the semiconductor unit 65, the protection member P1 and the holding member P2. However, conversely, the semiconductor unit 65, the protection member P1 and the holding member P2 may be moved with respect to the roller L.

Figure 11:
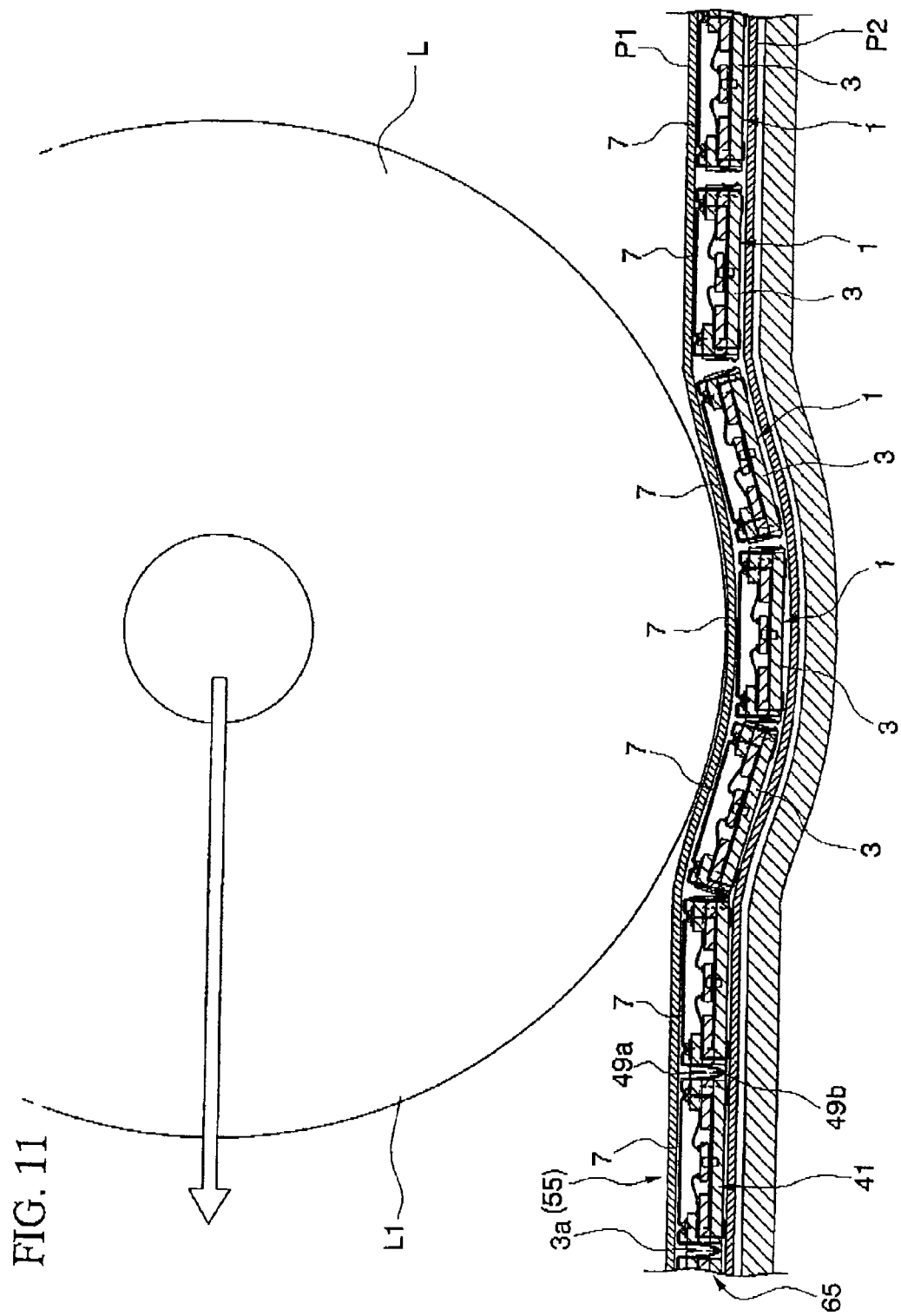
FIG. 11 is a sectional view that shows another example of the dividing step in the manufacturing method of the semiconductor device according to the present invention.

Moreover, the circumference surface L1 of the roller L may be pressed from the above side against the top surface 3a side of the substrate plate member 41 as shown in FIG. 11. Furthermore, in the case where the dividing step is carried out using the roller L as described above, the roller L may moved by rolling it on the protection member P1.

Moreover, a breaking method for the remaining sections of the cuts 49a and 49b in the dividing step is not limited to bending the substrate plate member 41 using the roller L. That is to say, in the dividing step, a shear stress may be created in the remaining sections of the cuts 49a and 49b to break the remaining sections of the cuts 49a and 49b by moving the pair of the ceramic substrates 3 of the substrate plate member 41 positioned on both sides of the cuts 49a and 49b in mutually opposite ways about the direction of thickness of the substrate plate member 41.

In the semiconductor device 1 manufactured by the manufacturing method described above, as shown in FIG. 3, since the remaining sections of the cuts 49a and 49b are constructed as a part of the side surface 3b of the ceramic substrate 3, a cut face 3d is formed in one part of the side surface 3b of the ceramic substrate 3. Furthermore, since the insert hole 51 for the side wall section 37 is divided into half by the breaking apart of the remaining sections of the cut 49a and 49b, it therefore becomes the cutaways 9 of the ceramic substrate 3. In other words, the side surface of the insert hole 51 becomes the side surface 9a of the cut 9.

According to the aforementioned semiconductor device 1 and lid 7, in the overlapping step, the respective lids 7 can easily be positioned with respect to a number of the semiconductor chips 5 at the same time by simply inserting the side wall sections 37 of the respective lids 7 into the insert holes 51 formed in the substrate plate member 41. In other words, when the respective lids 7 cover the respective semiconductor chips 5, since the respective ceramic substrates 3 are pinch held by the side wall sections 37 of the lids 7, the top plate section 35 can be easily positioned with respect to the respective ceramic substrates 3, and the lid 7 can be easily positioned with respect to the ceramic substrate 3.

Furthermore, the lid 7 having conducting properties and the shield member 23 of the ceramic substrate 3 surround the respective semiconductor chips 5. Specifically, the top plate section 35 of the lid 7 covers the upper side of the semiconductor chip 5, and the side wall section of the lid 7 covers the sides of the semiconductor chip 5, and furthermore the shield member 23 covers the lower side of the semiconductor chip 5. These lid 7 and shield member 23 are electrically connected to each other, and the electric potentials of the lid 7 and the shield member 23 are equal.

Accordingly, these conductive lid 7 and shield member 23 prevent electrical noise that occurs outside of the semiconductor device 1 from entering into the hollow space S2 and reaching the semiconductor chip 5. In other words, a noise related malfunction of the semiconductor chip 5 can be reliably prevented Next, a second embodiment of the semiconductor device according to the present invention is described with reference to FIG. 12 and FIG. 13. Components the same as those of the first embodiment are denoted by the same reference symbols, and their description is omitted. In a semiconductor device 101 of the second embodiment, side wall sections 71 are formed at all corner sections of the top plate section 35 of the lid 107. The material of the lid 107 is similar to that of the first embodiment. The side wall sections 71 may be formed in only one pair of opposing corner sections of the top lid section 35.

Figure 12:
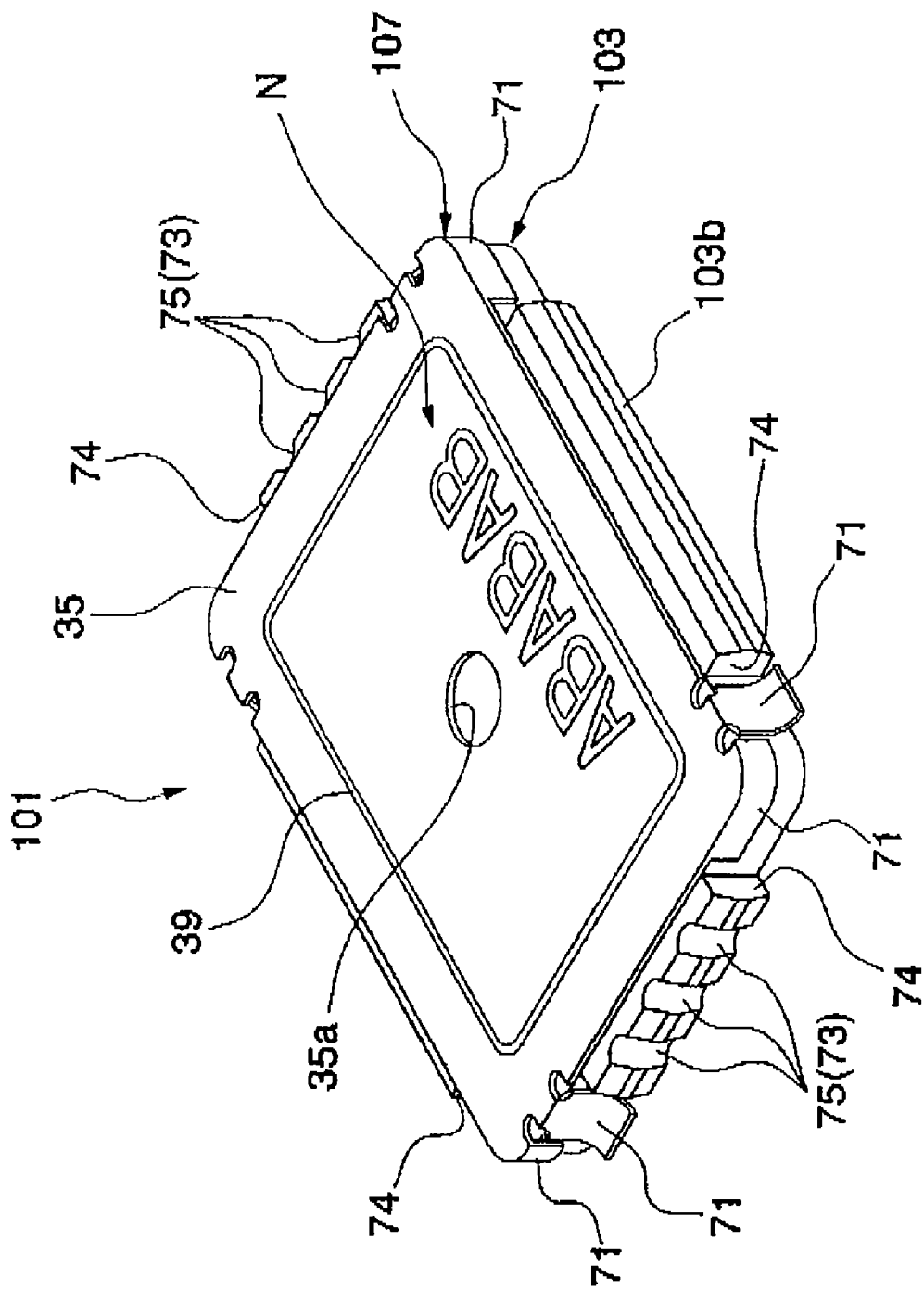
FIG. 12 is a perspective view that shows a semiconductor device according to a second embodiment of the present invention seen from a lid side.
Figure 13:
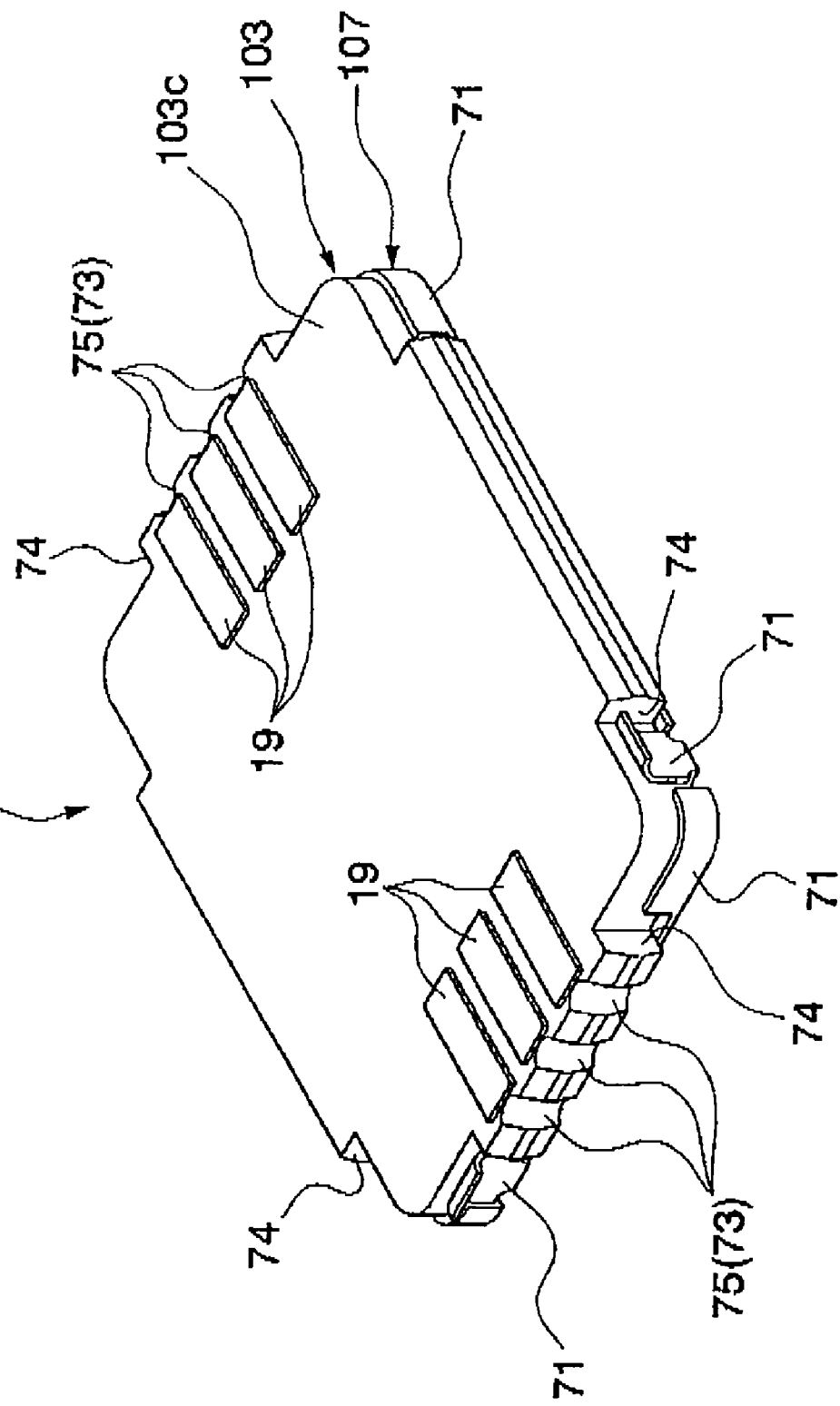
FIG. 13 is a perspective view that shows the semiconductor device in FIG. 12 seen from a ceramic substrate side.
Figure 14:
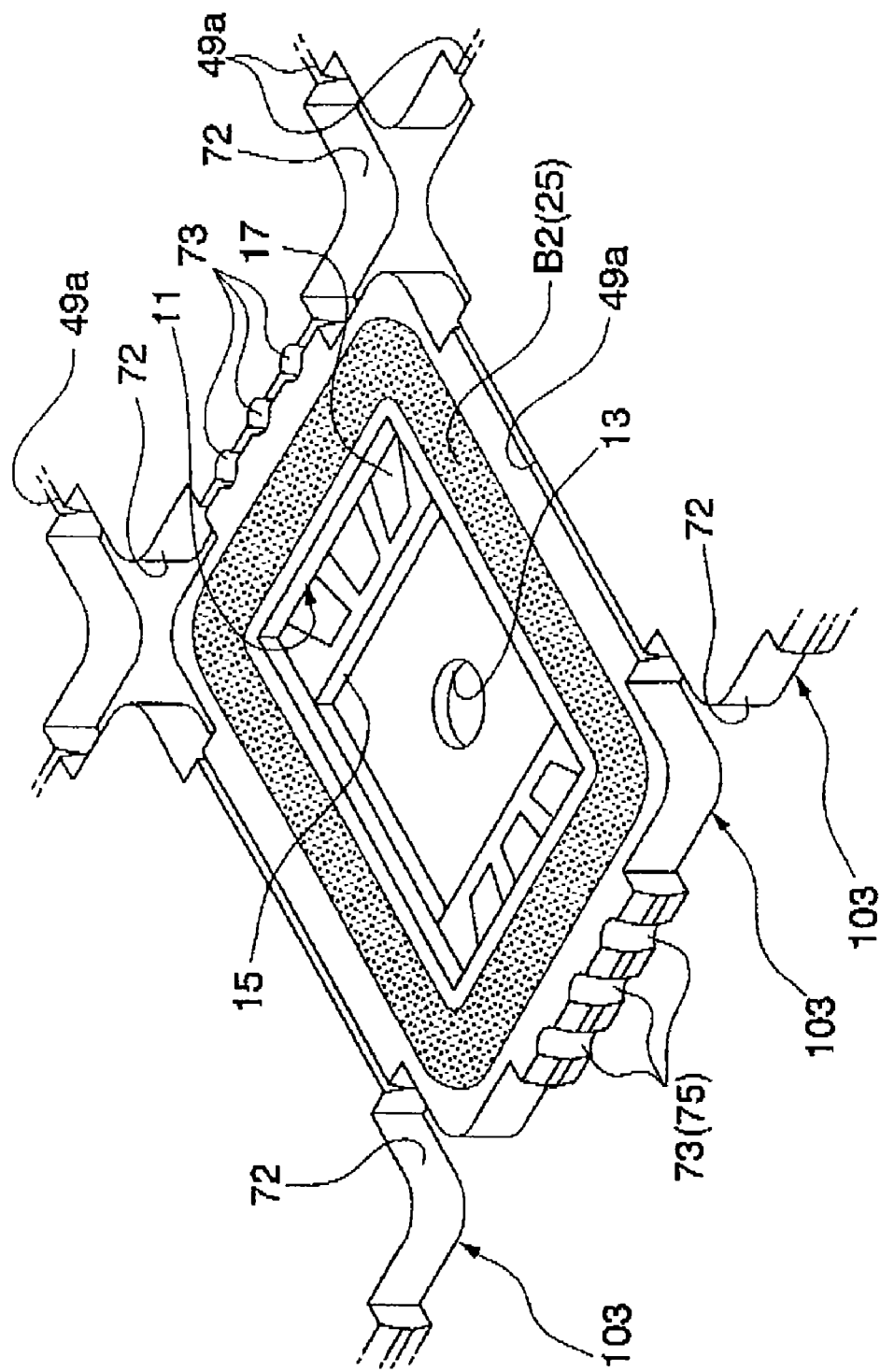
FIG. 14 is an enlarged perspective view that shows a substrate plate member used for manufacturing the semiconductor device in FIG. 12.
Figure 15:
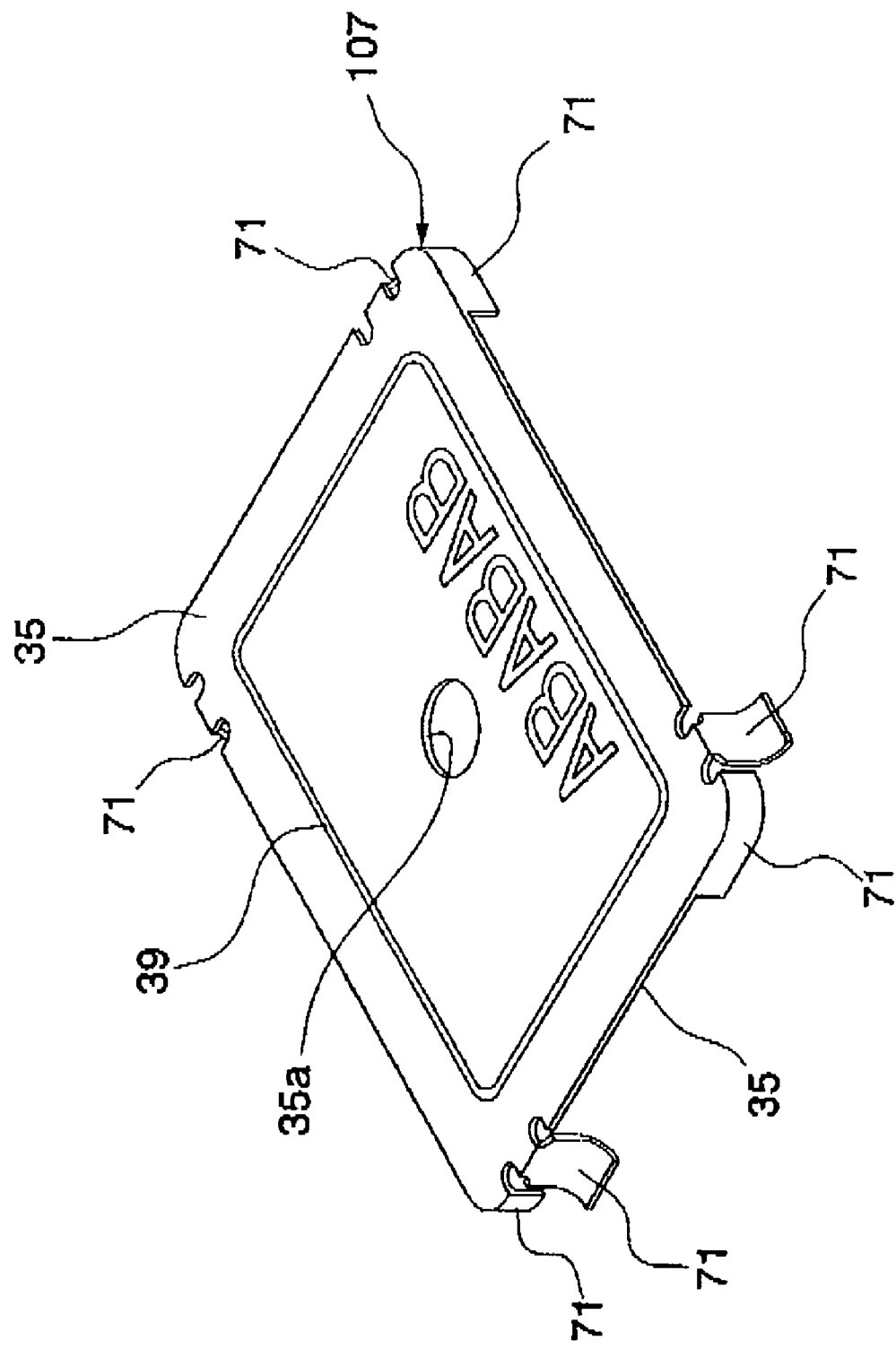
FIG. 15 is a perspective view that shows a lid used for manufacturing the semiconductor device in FIG. 12.

As described above, in the case of forming the side wall sections 71 in all four corners of the top plate section 35, as shown in FIG. 14, in the substrate plate member preparation step, respective insert holes 72 into which the respective side wall sections 71 are inserted are formed in the parts where the cuts 49a and 49b intersect. As shown in FIG. 12 and FIG. 13, the insert hole 72 becomes a cutaway 74 formed in each of the corner sections of a ceramic substrate 103 after the dividing step. Furthermore, as shown in FIG. 15, in the lid preparation step, the side wall sections 71 are formed in each of the corner sections of the top plate section 35 of the lid 7.

Furthermore, in the case of forming each insert hole 72 in the intersection parts of the cuts 49a and 49b, through holes 73 are formed in positions away from the above intersection parts of the cuts 49a and 49b in the substrate plate member preparation step as shown in FIG. 14, the number of through holes 73 being as many as the number of the external connection terminals 19. The respective external connection terminals 19 are formed in positions in contact with the respective through holes 73.

In the case of this construction, the through hole 73 is divided by the breaking apart of the remaining section of the cuts 49a and 49b in the dividing step, resulting in the formation of a concaved cutaway 75 exposed to a side face 103b of the ceramic substrate 103. This concaved cutaway 75 has an effect of improving solder leak or penetration with respect to the respective connection terminals 19 when mounting the semiconductor device 1 on a mounting substrate (not shown in the diagram) by soldering. That is to say, electrical connection between the semiconductor device 1 and the mounting substrate can be reliably performed.

In the aforementioned embodiments, the substrate plate member 41 is used when manufacturing the semiconductor device 1 or 101, however, it is not limited to this. That is to say, the lids 7 may be overlapped and fitted onto pre-divided individual ceramic substrates 3 to manufacture the semiconductor device.

Also in the case of this construction, when overlapping and fitting the lid 7 or 107 on the ceramic substrate 3, by respectively engaging the pair of opposing side wall sections 37 or 71 with the cutaways 9 or 74 and moving them along the side surface 3b or 103b of the ceramic substrate 3 or 103, the ceramic substrate 3 or 103 can be pinch held by these pair of the side wall sections 37 or 71. Therefore, the top plate section 35 can be easily positioned with respect to the ceramic substrate 3 or 103, and the lid 7 or 107 can be easily positioned with respect to the ceramic substrate 3 or 103.

Figure 16:
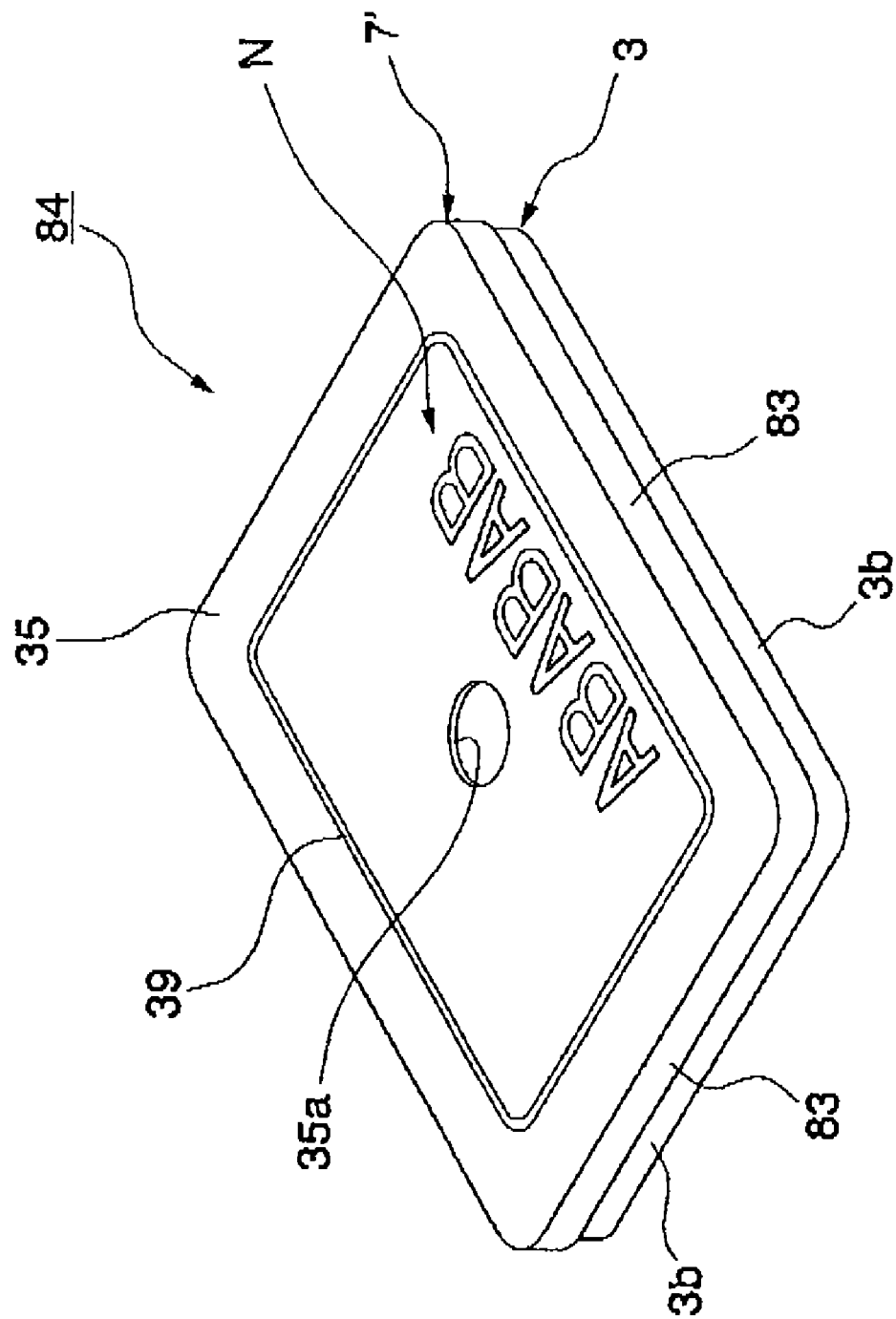
FIG. 16 is a perspective view that shows another example of the lid used for manufacturing the semiconductor device in FIG. 12.
Figure 17:
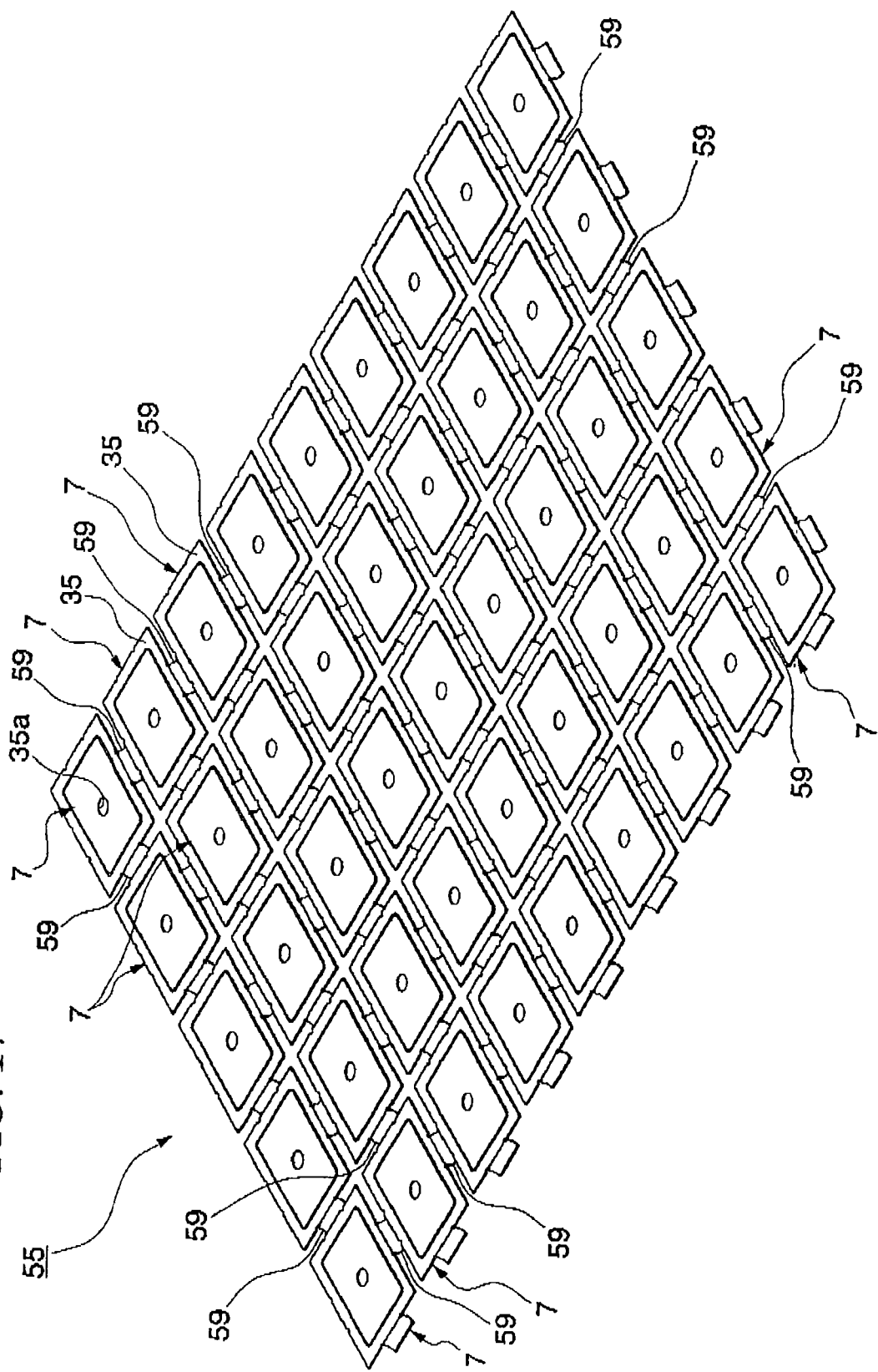
FIG. 17 is a schematic perspective view that shows a lid plate member used in a second manufacturing method of the semiconductor device according to the first embodiment of the present invention.
Figure 18:
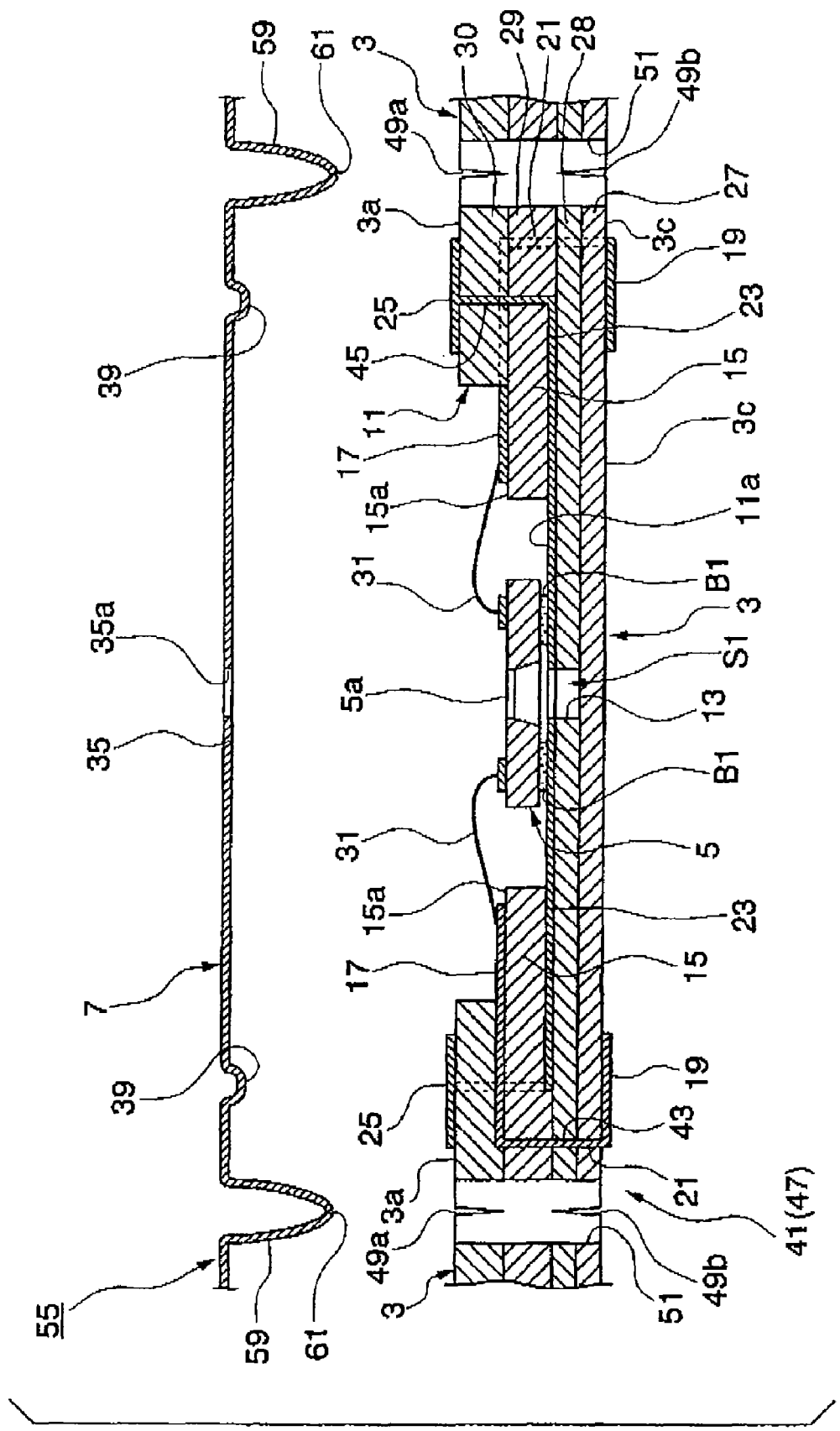
FIG. 18 is a sectional side view that shows the second manufacturing method of the semiconductor device according to the first embodiment of the present invention.

Furthermore, as shown in FIG. 16, the lid 7' may have side wall sections 83 formed around the whole periphery of the top plate section 35, In the case of this construction, since the side of the semiconductor chip 5 is covered by the side wall section 83 having conducting properties, even if noise occurs outside of a semiconductor 84, the side wall sections 81 and 83 prevent the noise from entering the hollow space S2 of the semiconductor device 84 and reaching the semiconductor chip 5. As a result, a malfunction of the semiconductor chip 5 due to noise can be reliably prevented.

Furthermore, as a method for preventing the above described noise from entering the hollow space S2 from the side of the semiconductor device 1 or 101, there is a method of applying or spraying a copper or silver conductive paste having conducting properties on the side surface 3b or 103b and the cutaways 9 and 74 of the ceramic substrate 3 or 103.

Application or spraying of this conductive paste need only be carried out on at least the side surfaces 3b or 103b and the cutaways 9 and 74 of the ceramic substrate 3 or 103 that are not covered by the side wall sections 37, 71, 81, or 83 of the lid 7 or 107.

Moreover, an example of the cutaways 9 and 74 being formed in the substrate thickness direction entirely on the area from the top surfaces 3a and 103a to the reverse surfaces 3c and 103c of the ceramic substrates 3 and 103 has been described. However, it is not limited to this. That is to say, the cutaways 9 or 94 may be formed only at least on the top surface 3a side or 103a side of the ceramic substrate 3 or 103. In this case, the insert holes 51 or 72 of the substrate plate member 41 formed for the cutaways 9 or 74 are closed-end concaved sections that are recessed from the top surface of the substrate plate member 41.

Furthermore, in the case where a plurality of the side wall sections 37, 71 or 81 are formed on the lid 7 or 107, the cutaways do not need to be formed on the side surface 3b or 103b of the ceramic substrate 3 or 103.

Next, a second manufacturing method of the aforementioned semiconductor device 1 (FIG. 1 and FIG. 2) of the first embodiment according to the present invention is described.

In the second manufacturing method, the substrate plate member preparation step described with reference to FIG. 4 and FIG. 5 is same as in the first manufacturing method.

In this second manufacturing method, a lid plate member 55 formed from a number of the lids 7 integrally joined in an arrangement similar to that of the concave sections 11 formed in the above substrate plate member 41 is formed before, after, or in parallel with, the above substrate plate preparation step (lid preparation step).

As shown in FIGS. 17, 18, 19A and 19B, in this lid preparation step, a plate member having conducting properties, such as a copper material or a 42 alloy, that has been plated with nickel, chrome, or gold, or a plate member of nickel silver is prepared. Next, a punching process is carried out on this plate member to form the top plate section 35 of each lid 7 and a joint section for joining adjacent top plate sections 35. This joint section is formed in a plate shape. Cutaway holes 57 (FIG. 19A) are formed at the borders between the top plate section 35 and the respective joint sections so that the respective joint sections can be easily bent with respect to the top plate section 35, Moreover, a punching process similar to that described above is carried out to form the aperture section 35a in the respective top plate sections 35.

Figure 19A:
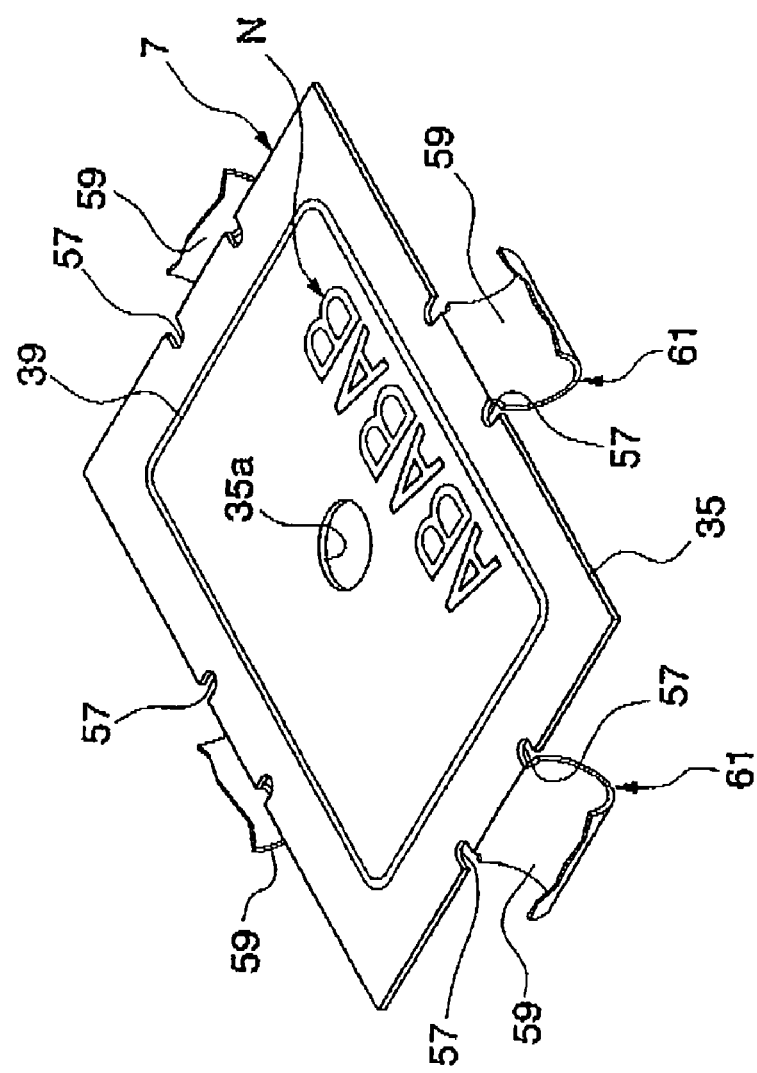
FIG. 19A and FIG. 19B are an enlarged perspective view and an enlarged sectional side view that show the lid plate member shown in FIG. 17.
Figure 19B:
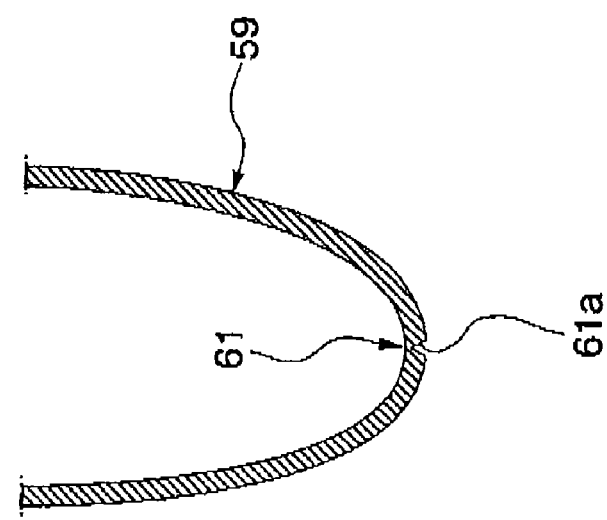

Furthermore, in this lid preparation step, the respective joint sections are bent in a substantially U shape to form bent sections 59 that project in the thickness direction of the respective lids 1. A breaking section 61 that can be easily broken apart is formed on the tip end portion of the respective bent section 59. It is preferable that a cutaway 61a is formed in the breaking section 61 on the outer surface side of the bent section 59 by means of press work or half etching as shown in FIG. 19B. However, it may be thinly formed on the tip end portion of the bent section 59 by means of press work. Furthermore, in this lid preparation step, the top plate section 35 is deformed by means of a coining process to form a substantially annular shaped projection section 39 that projects in the same direction as that of the bent section 59 mentioned above.

As with the first manufacturing method, a number of semiconductor chips 5 are mounted on the substrate plate member 41 and electrically connected by a chip arrangement step and electrical connection step.

Figure 20:
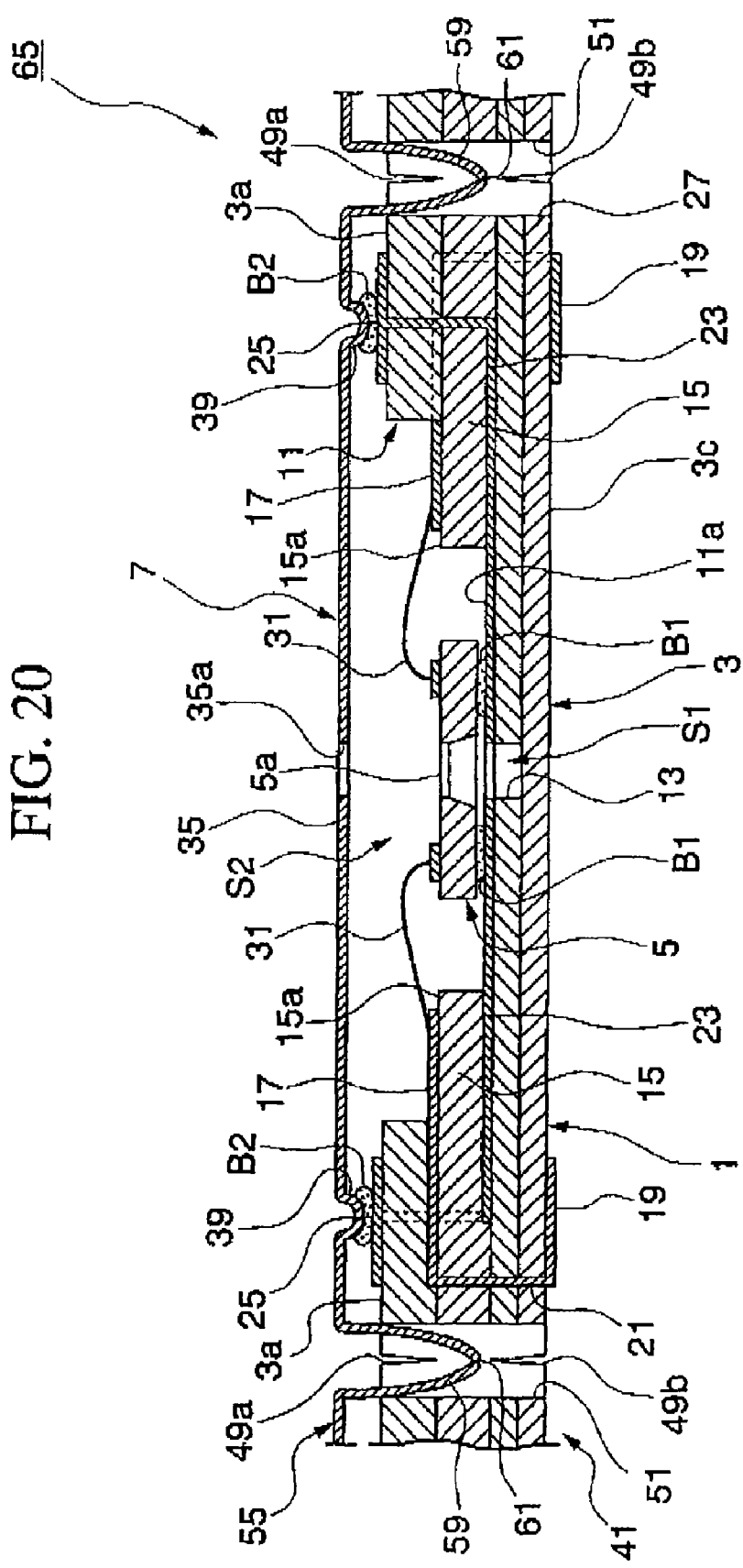
FIG. 20 is a sectional view that shows the second manufacturing method of the semiconductor device according to the first embodiment of the present invention.

After completion of the above steps, a conductive paste B2 is printed on the connection pad 25, and then the lid plate member 55 is overlapped and fixed on the top surface 3a of the substrate plate member 41 as shown in FIG. 20 so that a number of the lids 7 individually cover a number of the semiconductor chips 5 (overlapping step).

At this time, the bent sections 59 of the lid plate member 55 are respectively inserted into the insert holes 51 of the substrate plate member 41. Thus, the respective lids 7 can be easily positioned with respect to a number of the semiconductor chips 5 simultaneously. Moreover, at this time, the projection sections 39 of the respective top plate sections 35 are brought into contact with the above conductive paste B2. As a result, the lid 7 and the shield member 23 are electrically connected to each other.

Subsequently, as with the first manufacturing method, as shown in FIG. 9, the lid plate member 55 and the substrate 41 are flipped over, and a metal weight M is mounted on the reverse surface 3c of the substrate plate member 41. In this state, conductive paste curing, in which heat is applied constantly at 150° C. for approximately one hour, is carried out to harden the conductive paste B2. As a result, the lid plate member 55 is fixed on the substrate plate member 41, completing the overlapping step.

By completing this overlapping step, a semiconductor unit 65, comprising a number of semiconductor devices 1 integrally joined, is constructed.

Subsequently, as with the first manufacturing method, a name for identifying the semiconductor device 1 or an identification symbol N such as a serial number (refer to FIG. 1) is printed on the top surface of the respective lids 7. Next, a dividing step is carried out using a roller L shown in FIG. 10 and FIG. 11 By carrying out this dividing step, the substrate plate member 41 and the lid plate member 55 are broken apart into individual semiconductor devices 1 at the cuts 49a, 49b and the breaking section 61.

In the semiconductor device 1 manufactured in the above second manufacturing method, the bent section 59 is cut in the breaking section 61, and a half of the bent section 59 becomes the side wall section 37 of the lid 7, as shown in FIG. 1 to FIG. 3. The surface of the break is formed on the tip end of the side wall section 37 of the lid 7.

According to this second manufacturing method of the semiconductor device 1, in the substrate plate preparation step and lid preparation step, the bent section 59 that already has the cuts 49a, 49b and the breaking section 61 is formed. Therefore, in the dividing step, by simply bending the substrate plate member 41 and the lid plate member 55 at the same time using the roller L, the remaining sections of the cuts 49a, 49b and the easy breaking section 61 can be easily broken apart. Accordingly, the substrate plate member 41 and the lid plate member 55 can be divided into individual ceramic substrates 3 and lids 7. That is to say, a large number of semiconductor devices 1 can be easily manufactured at once.

Moreover, according to this manufacturing method, in the overlapping step the respective lids 7 can be easily positioned with respect to a number of the semiconductor chips 5 simultaneously simply by inserting the bent sections 59 of the lid plate member 55 into the insert holes 51 formed in the substrate plate member 41. As a result, manufacturing efficiency for the semiconductor device 1 can be improved.

Furthermore, according to the above semiconductor unit 65, just before the dividing step, one semiconductor unit 65 in which a number of the semiconductor devices 1 are integrally fixed is constructed. By transporting this semiconductor unit 65 in this state, a large number of the semiconductor devices 1 can be more easily transported, than by transporting a large number of the individually divided semiconductor devices 1.

Figure 21A:
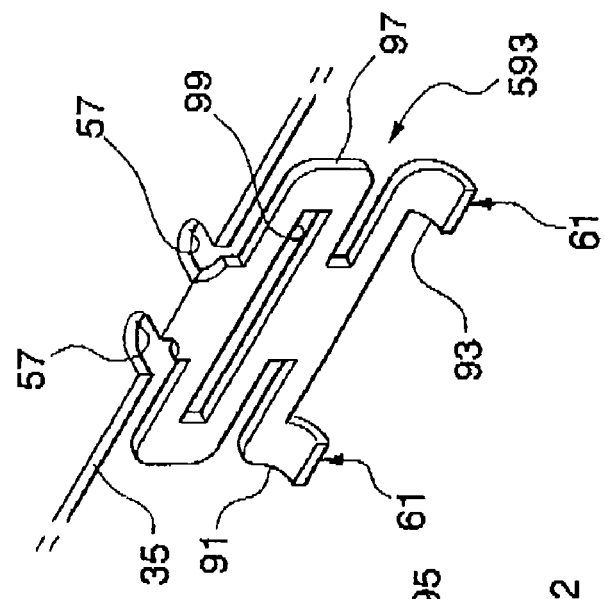
FIG. 21A, FIG. 21B, and FIG. 21C are enlarged perspective views that show modified examples of a flection section of the lid plate member shown in FIG. 17.

In the above lid preparation step, an example of the respective joint sections of plain plate shape has been described, however it is not limited to this shape. That is to say, as shown in FIG. 21A, when carrying out the punching process, a joint section may be formed with a middle section 91 that is wider than its base portion, and a substantially rectangular through hole 93 may be formed in this middle section 91 in a position that includes the breaking section 61.

Figure 21B:
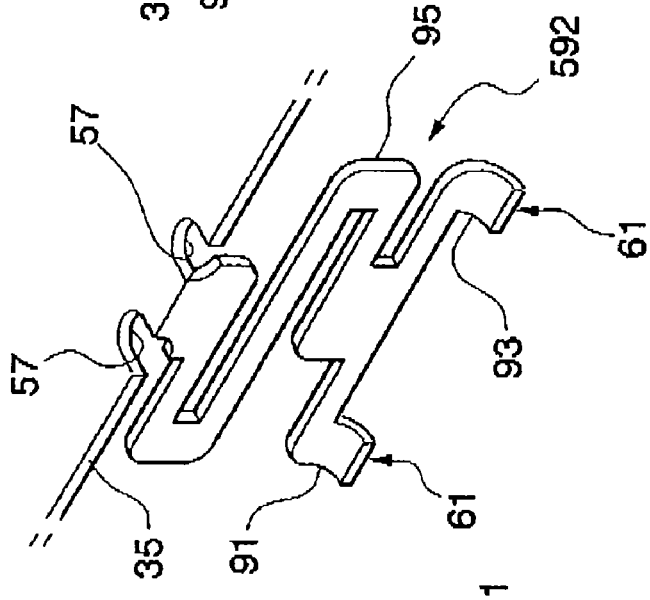
Figure 21C:
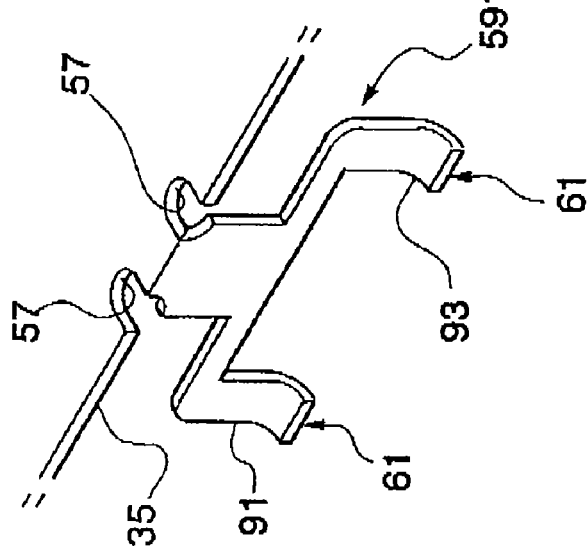
Figure 22:
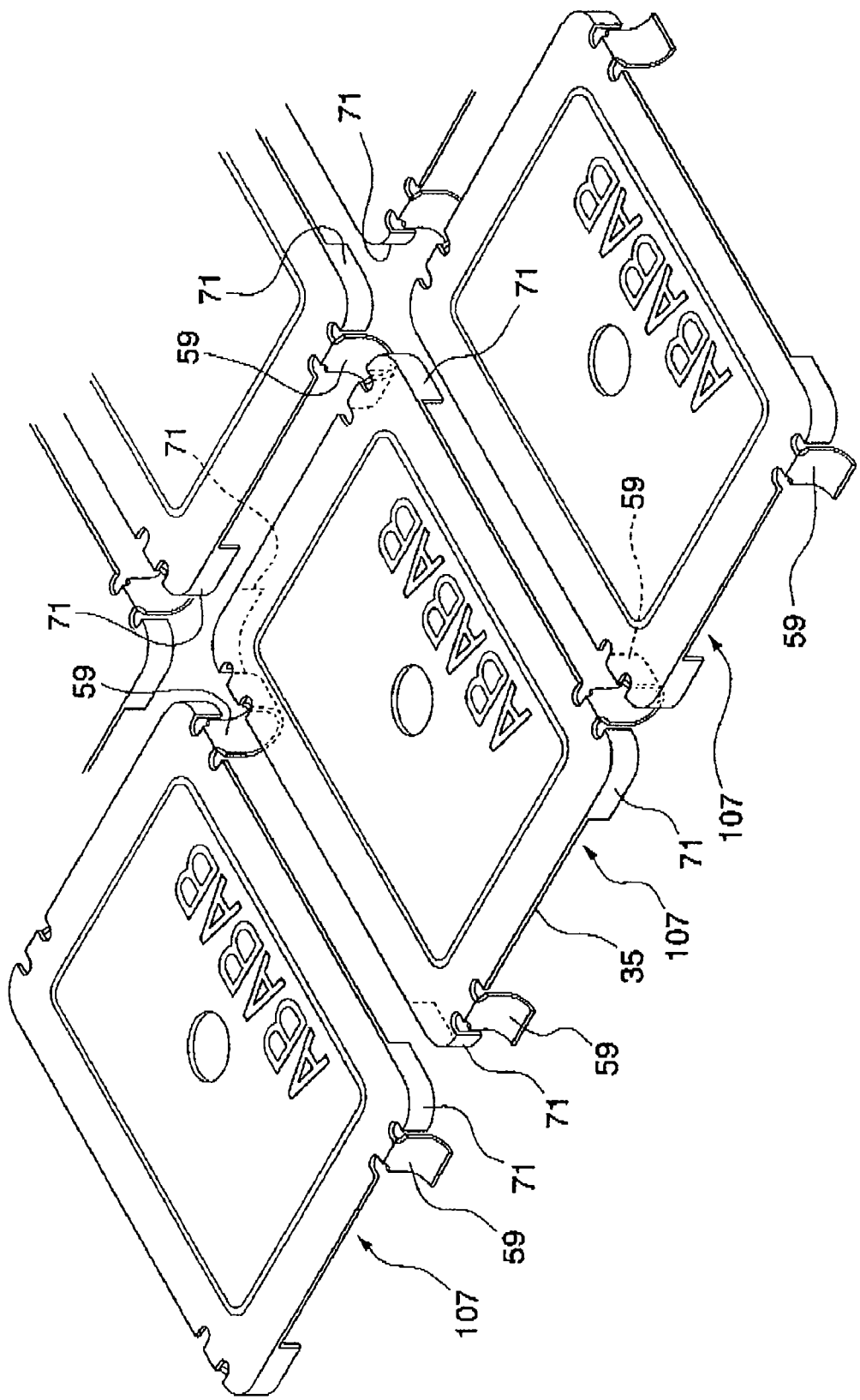
FIG. 22 is an enlarged perspective view that shows a lid plate member used in the second manufacturing method of the semiconductor device according to the second embodiment of the present invention.

Moreover, as shown in FIG. 21B, a meandering section 95 that meanders between the base portion of each joint section and the above middle section 91 may be formed in the respective joint sections. Furthermore, for example, as shown in FIG. 21C, a wide intermediate section 97 may be formed between the base portion of the joint section and the middle section 91, and a through hole 99 may be further formed in this intermediate section 97. In the case of these configurations, by forming the through holes 93, 99 and the meandering section 95 in the joint section, the joint section can be bent more easily by a press process to form the bent sections 591 to 593.

Next, a second manufacturing method of the semiconductor device 101 according to the second embodiment of the present invention shown in FIG. 12 and FIG. 13 is described.

In this manufacturing method, in the lid preparation step, the side wall sections 71 of each lid 107 are formed in each corner section of the top plate section 35 as shown in FIG. 15. The bent section 59, which becomes a joint portion of each lid 7, is formed in a position independent of the side wall section 71 and away from the above corner section. In the case of this configuration, since the side wall sections 71 of the respective top plate sections 35 are arranged in the corner sections of the respective ceramic substrates 103, the lids 107 can easily be positioned with respect to the respective ceramic substrates 103.

In this lid preparation step, for example, it is preferable that at least the tip end section of the bent section 59 of the lid plate member 55 to be inserted into the insert hole 51 be hardened in order to make it hard and breakable.

Figure 23:
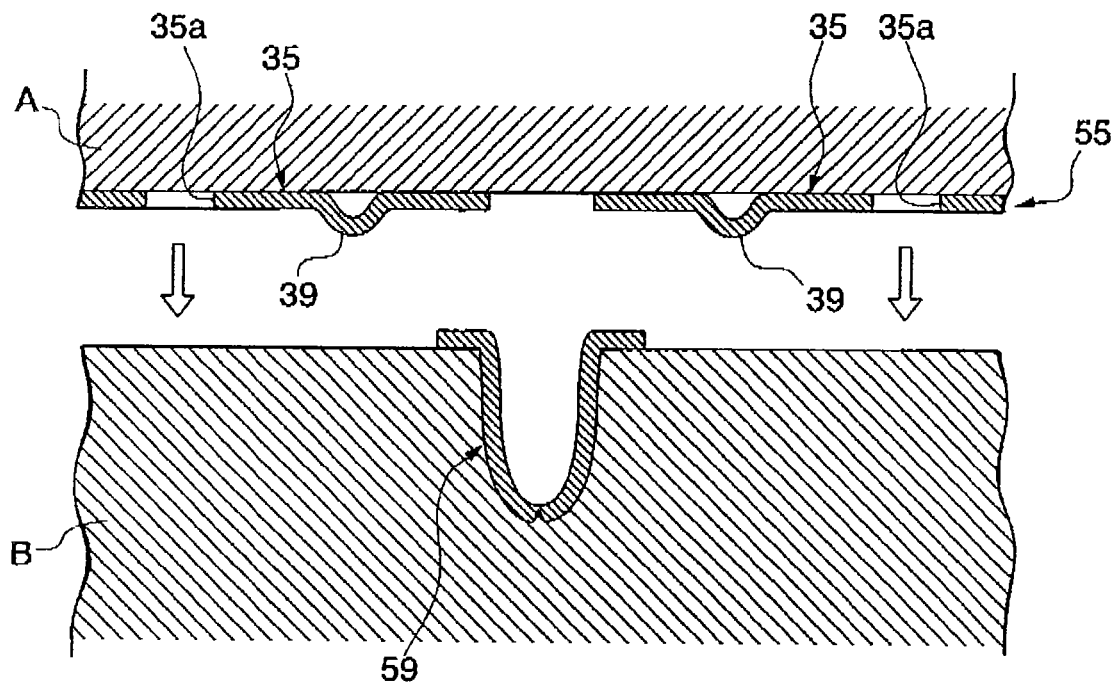
FIG. 23 is a sectional side view that shows an example of a lid preparation step in the manufacturing method of the semiconductor device according to the present invention.

Moreover, in this lid preparation step, as shown in FIG. 23, the top plate section 35 and the bent section 59 may be separately formed, and these top plate section 35 and bent section 59 may be pressed against and brought into contact with each other to construct the lid plate member 55 using metal molds A and B. In this case, the bent section 59 is formed from a metallic material harder and more breakable than that of the top plate section 35. In these cases, the breaking section 61 can be broken apart more easily.

In the example described above, the insert hole 51 is formed in the substrate plate member 41 and the substantially U-shaped bent section 59 is formed in the lid plate member 55. However, it is not limited to this. At least, only the cuts 49a, 49b and the breaking section 61 need to be respectively formed in the substrate plate member 41 and the lid plate member 55. In the case of this construction, the lid 7 is constructed only from the top plate section 35, and the cut face formed by the breaking section 61 is formed in the top plate section 35. Even in this construction, during the overlapping step, a large number of the lids 7 can be arranged in positions that individually cover a number of the semiconductor chips 5 by simply overlapping and positioning the lid plate member 55 on the top surface of the substrate plate member 41. Therefore, efficiency of manufacturing the semiconductor device 1 can be improved and cost in manufacturing the semiconductor device 1 can be reduced.

Figure 24A:
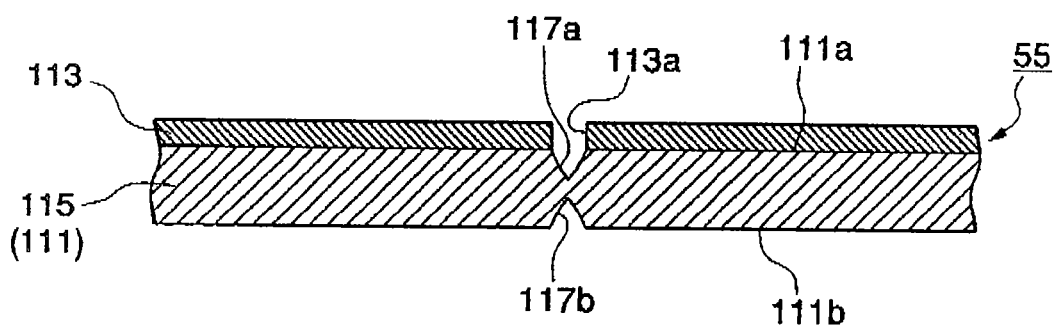
FIG. 24A and FIG. 24B are sectional side views that show other examples of the lid preparation step in the manufacturing method of the semiconductor device according to the present invention.
Figure 24B:
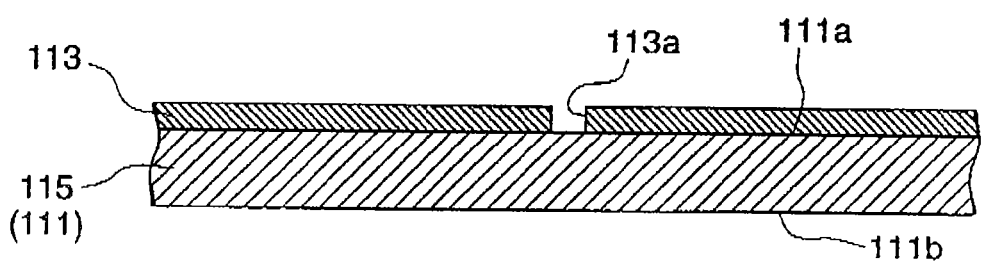

As described above, in the case where the bent section 59 is not formed on the lid plate member 55, the lid plate member 55 is formed by forming a thin metallic film 113 on a top surface 111a of a substantially plate shape ceramic plate member 111 as shown in FIG. 24A. When manufacturing the lid plate member 55 of this construction, as shown in FIG. 24B, a green sheet 115 formed in a sheet form from paste containing ceramic powder is prepared, and then the thin metallic film 113 is formed on the top surface 111a of the green sheet 115 by screen printing or the like. When carrying out this printing, a groove 113a is pre-formed in a position corresponding to the cuts 49a and 49b of the substrate plate member 41, in the thin metallic film 113. That is to say, a pattern is printed in which the thin metallic film 113 is not formed in the positions corresponding to the cuts 49a and 49b. Next, as shown in FIG. 24A, cuts (breaking sections) 117a and 117b are formed in the position where the above groove 113a is formed among the top surface 111a and reverse surface 111b of the green sheet 115, and then the green sheet 115 is baked to form the ceramic plate member 111.

In the case of this construction, the lid plate member 55 can be easily broken apart at the cuts 117a and 117b together with the ceramic substrate plate member 41 in the dividing step. The lid plate member 55 of the above configuration is overlapped and fixed on the substrate plate member 41 so that the thin metallic film 113 opposes the substrate plate member 41 in an overlapping step. As a result, the thin metallic film 113 can be electrically connected to the connection pad 25 formed on the substrate plate member 41.

Next, a third embodiment of the semiconductor device according to the present invention is described with reference to FIG. 25 through FIG. 28.

Figure 25:
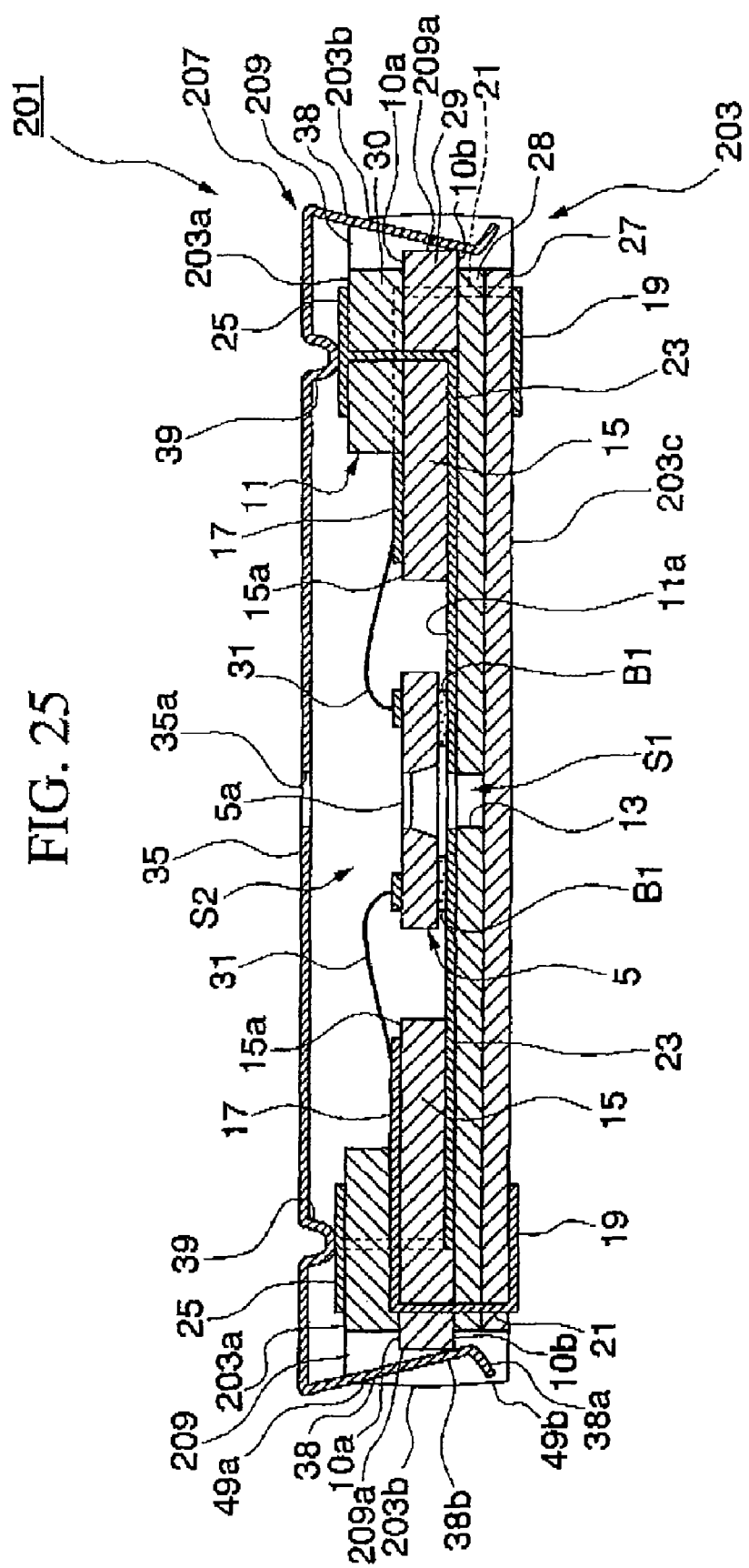
FIG. 25 is a sectional side view that shows a semiconductor device according to a third embodiment of the present invention.

As shown in FIG. 25, a semiconductor device 201 according to this embodiment is provided with: a ceramic substrate 203 formed in a substantially plate shape, and a semiconductor chip 5 and a lid 207 arranged and overlapped on a top surface 203a side of the ceramic substrate 203.

The ceramic substrate 203 is formed in a substantially rectangular plate shape, and a plurality of cutaways 209 that extend from the top surface 203a to a reverse surface 203c of the ceramic substrate 203 are formed on side surfaces 203b of the ceramic substrate 203. In this cutaway 209 there are formed a lead-in step section 10a on the top surface 203a side of the ceramic substrate 203, that is further recessed from a side surface 209a of the cutaway 209, and an latching step section 10b on the reverse surface 203c side of the ceramic substrate 203, that is further recessed from the side surface 209a.

Since other constructions are similar to that of the semiconductor 1 of the first embodiment, the same components are denoted by the same reference numbers and descriptions thereof are omitted.

The lid 207 has a top plate section 35 similar to that of the lid 7 of the first embodiment. Side wall sections 38 are formed in pairs on the four sides of the top plate section 35, and respectively engage with a plurality of the cutaways 209 formed in the side surface 203b of the ceramic substrate 203. That is to say, they are pressed against and brought into contact with the side surfaces 209a of each of the cutaways 209.

The tip end sections 38a of each pair of side wall sections 38 engage inside the latching step section 10b of the ceramic substrate 203. That is to say, each of the tip end sections 38a is inserted into the latching step section 10b.

Moreover, each intermediate section (latching section) 38b of the pairs of side wall sections 38 contacts elastically with the side surface 209a of the cutaway 209. That is to say, each of the latching sections 38b is pressed against the latching step section 10b of the cutaway 209 due to elastic deformation of the side wall section 38, and is latched with the side surface 209a of the cutaway 209 by a frictional force that occurs thereby. Therefore, these pairs of side wall sections 38 pinch hold the ceramic substrate 203.

As described above, the lid 7 is fixed on the ceramic substrate 3 due to the hooking of the side wall section 38 and the latching step section lob and due to the ceramic substrate 203 being pinch held by the side wall section 38. In this fixed state, the projection section 39 of the top plate section 35 is kept in a state of being in contact with the connection pad 25 of the ceramic substrate 203.

Next, a manufacturing method of the semiconductor device 201 according to the third embodiment constructed as described above is described.

In a substrate plate preparation step, similarly to the manufacturing method mentioned above, first, green sheets that constitute the respective insulating layers 27, 28, 29, and 30 of the ceramic substrate 203 are prepared.

Next, the respective green sheets are subjected to a punching process to form the portions that become the cutaway 9, the lead-in step section 10a, the latching step section 10b, the concave section 11, the hole 13, and the step section 15 of the ceramic substrate 3. Through holes 43 and 45 to be used for forming the wiring section 21 and the shield member 23, as well as the pad electrodes 17, the external connection terminals 19, the wiring section 21, the shield member 23, and connection pad 25 are formed on this green sheet as with the manufacturing method described above.

The plurality of these green sheets are laminated to construct the green sheet laminated body 47. In this state, a large number of the insert holes 51 that pass through in the thickness direction of the green sheet laminated body 47 are formed in a portion where the cutaway 209, the lead-in step section 10, and the latching step section 10b are formed.

Also, the cuts 49a and 49b are formed in a grid pattern on the top surface and reverse surface of this green sheet laminated body 47. Finally, this green sheet laminated body 47 is baked at 1000° C. or more, and nickel or gold plating is applied to the pad electrode 17, the external connection terminal 19 and the connection pad 25 to complete the manufacturing of the substrate plate member 41.

Figure 26:
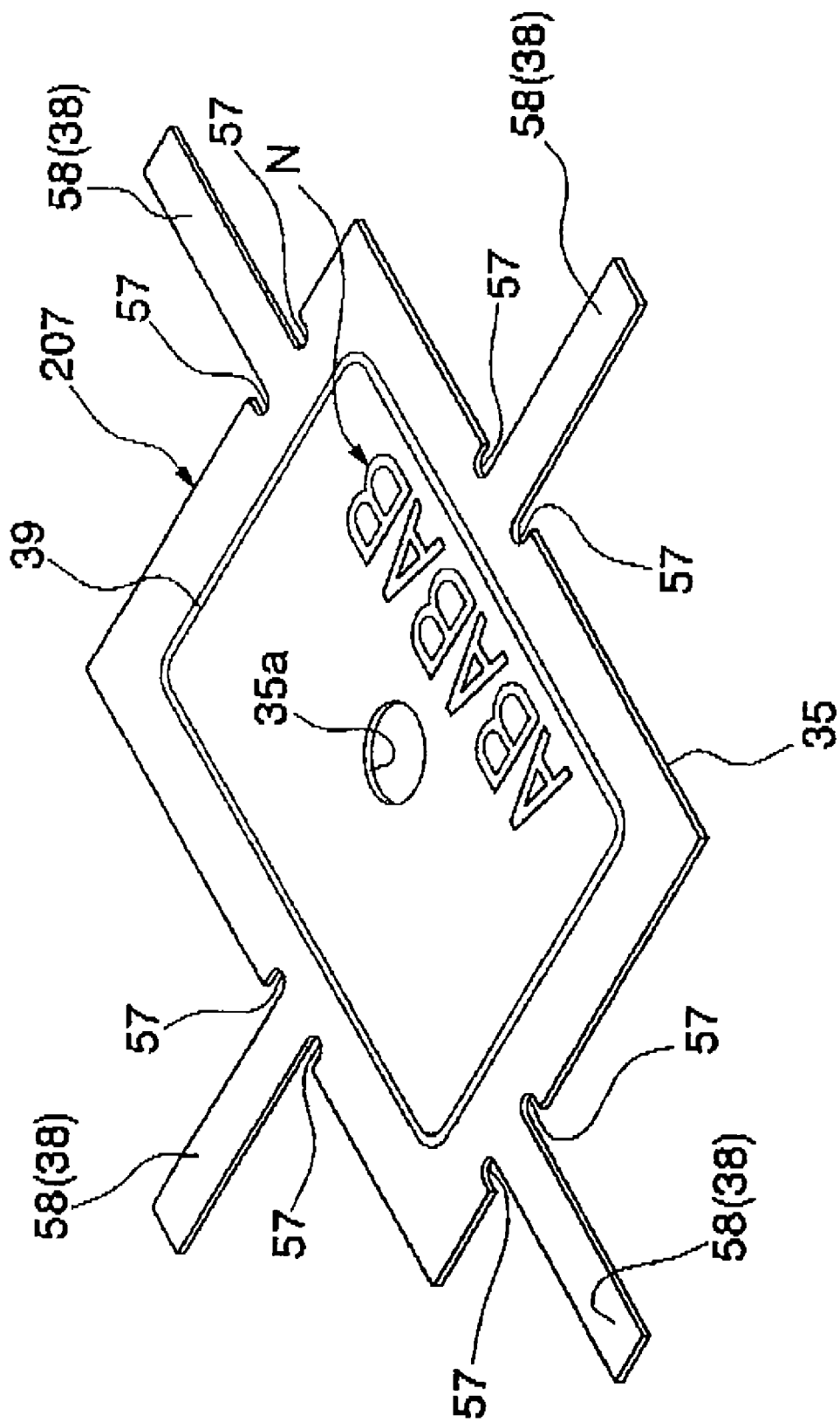
FIG. 26 is a perspective view that shows a lid used in manufacturing the semiconductor device in FIG. 25.

In the lid preparation step, a plate member is prepared similar to the first manufacturing method of the semiconductor device of the first embodiment, and the top plate sections 35 of a number of the lids 207 are formed in a similar way. Referring to FIG. 26, the lid 207 is formed with projection sections 58 that project from the respective sides of the top plate section 35. Cutaway holes 57 are formed at the borders between the top plate section 35 and the respective projection sections 58 so that the respective projection sections 58 can be easily bent with respect to the top plate section 35. The respective projection sections 58 are bent to become the side wall sections 38 that project in the thickness direction of the respective lids 207. The pairs of side wall sections 38 formed on each of the lids 207 so as to oppose to each other, are constructed so that the distance between their tip ends is shorter than the distance between the pair of the insert holes 51 so as to pinch hold the ceramic substrate 203.

Figure 27:
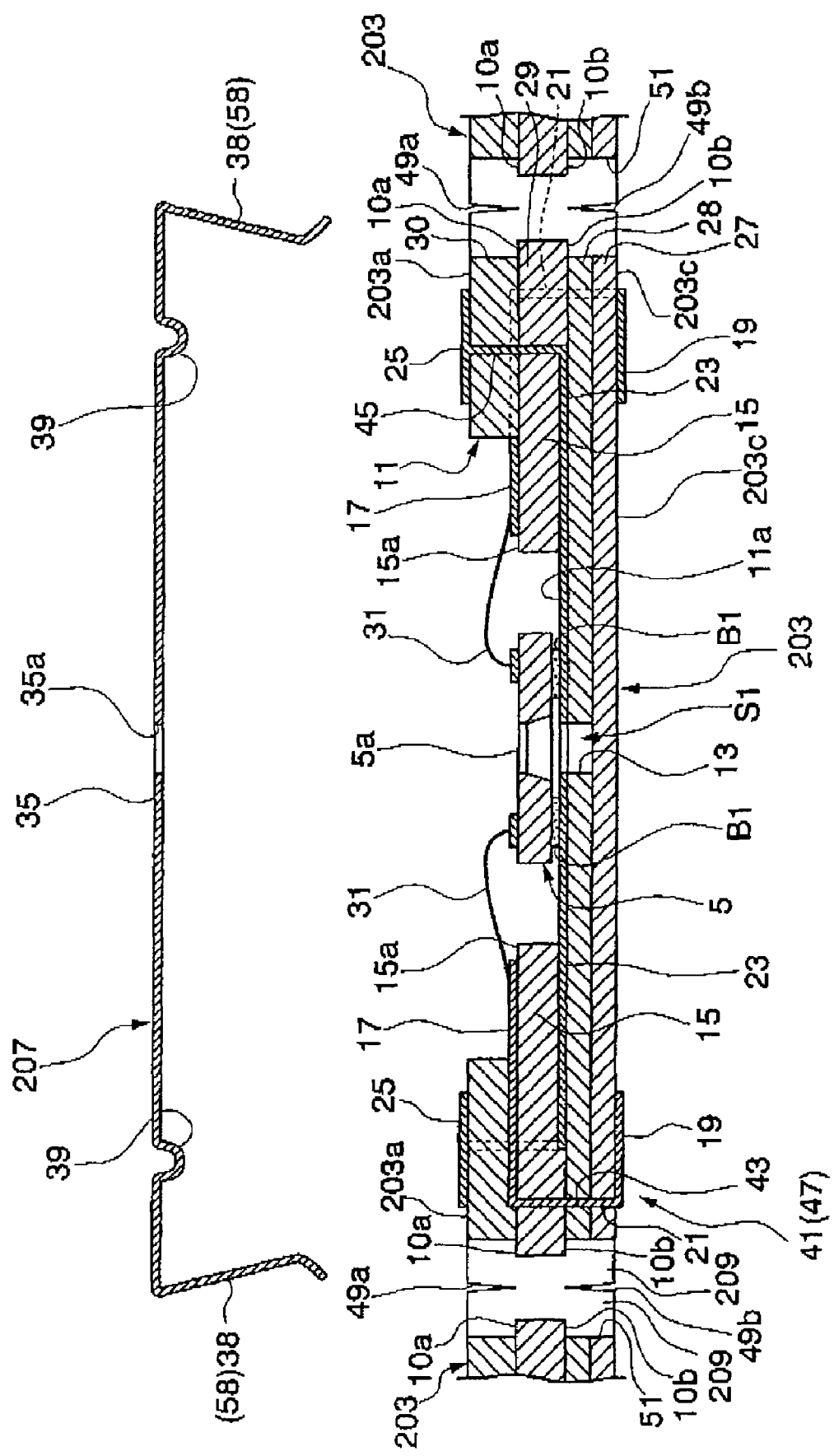
FIG. 27 is a sectional side view that shows a manufacturing method of the semiconductor device according to a third embodiment of the present invention.
Figure 28:
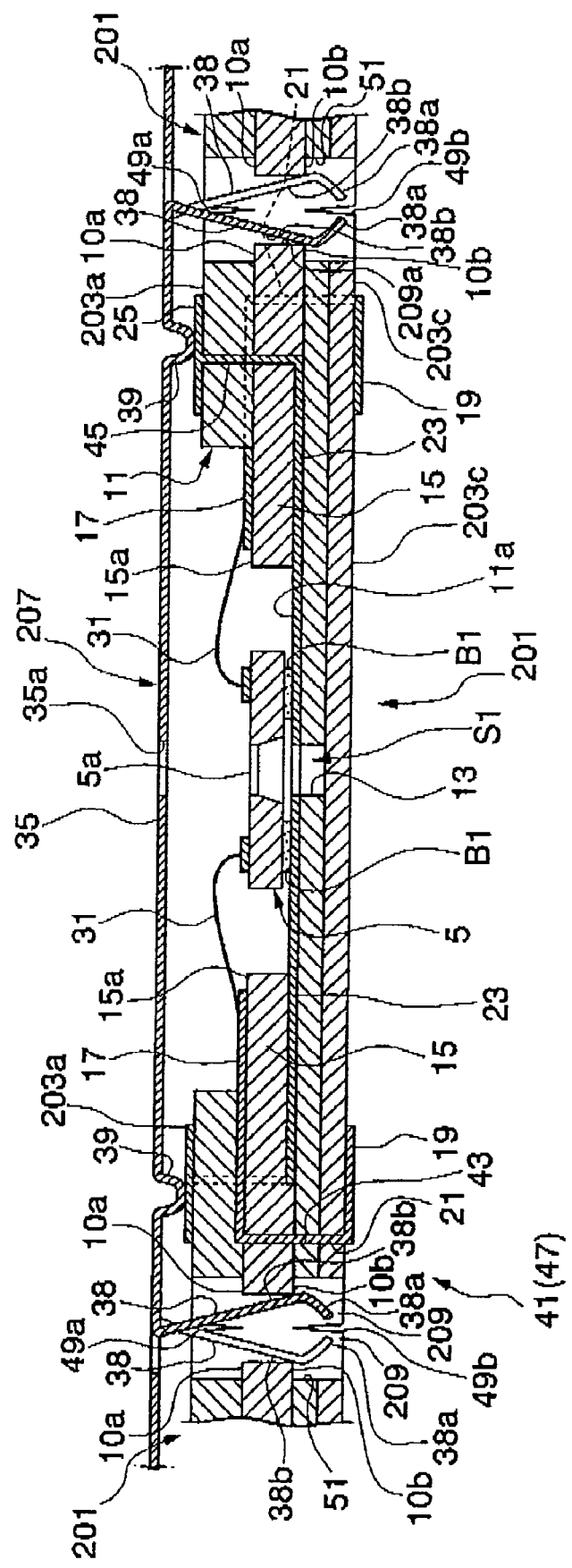
FIG. 28 is a sectional side view that shows a manufacturing method of the semiconductor device according to a third embodiment of the present invention.

Having carried out the chip arrangement step and electrical connection step for the substrate plate member 41 in a way similar to that of the first manufacturing method, as shown in FIG. 27 and FIG. 28, the number of lids 207 are overlapped and fixed onto the top surface 203a of the substrate plate member 41 so that a large number of the lids 207 individually covers a large number of the semiconductor chips 5 (overlapping step).

Here, the side wall sections 38 of the respective lids 207 are respectively inserted into the insert holes 51 of the substrate plate member 41. During this insertion, the pairs of the side wall sections 38 are elastically deformed by the lead-in step section 10a while being inserted into the insert holes 51, and the tip end sections 38a of the respective side wall sections 38 are positioned within the latching step section 10b. At this time, the projection section 39 of each of the top plate sections 35 is pressed against, and brought in contact with, the connection pad 25 of the ceramic substrate 3.

As described above, by respectively inserting the side wall sections 38 into the insert holes 51, the respective lids 207 can be easily positioned with respect to the number of the semiconductor chips 5. The respective lids 207 are fixed onto the substrate plate member 41 by positioning the tip end sections 33a of the side wall sections 38 into the latching step sections 10b and pinch holding the respective ceramic substrates 203 with a pair of the latching sections 38b. Moreover, since the projection sections 39 of each of the top plate sections 35 are pressed against and brought into contact with the connection pad of the ceramic substrate 3, the lid 207 and the shield member 23 are electrically connected to each other. This completes the overlapping step.

Subsequently, a dividing step is carried out using the roller L shown in FIG. 10 or FIG. 11, and the substrate plate member 41 is divided into the individual semiconductor devices 201 by breaking apart the substrate plate member 41 at the cuts 49a and 49b.

As described above, according to this manufacturing method, the respective lids 207 can be reliably fixed on the respective ceramic substrates 203 without use of an adhesive agent since the tip end sections 38a of the pair of the side wall sections 38 hook with the latching step section 10b and the latching sections 38b pinch hold the respective ceramic substrates 3. Therefore, manufacturing efficiency of the semiconductor device 1 can be improved while enabling easier handling during manufacturing.

Furthermore, the respective lids 207 can be easily positioned with respect to the a large number of the semiconductor chips 205 simply by inserting the side wall sections 38 of the lid 207 into the insert holes 51 formed in the substrate plate member 41. That is to say, when covering the respective semiconductor chips 5 with the respective lids 207, the top plate section 35 can be easily positioned with respect to the respective ceramic substrate 203 since the above side wall sections 38 pinch hold the respective ceramic substrates 203.

A latching section to be inserted into, and latch with a step section formed so as to recess from the side surface 203b side of the ceramic substrate 203 may be provided on the tip end sections 38a of the pair of the side wall sections 38. Also in the case of this construction, since the lid 207 can be prevented from falling off from the ceramic substrate 203, the lid 207 can be reliably fixed on the ceramic substrate 203.

Electrical connection of the shield member 23 of the ceramic substrate 3 and the lid 207 may be established by exposing a part of the shield member to the outside from the side surface 203b of the ceramic substrate 203, and connecting the side wall section 38 to this exposed part.

Figure 29:
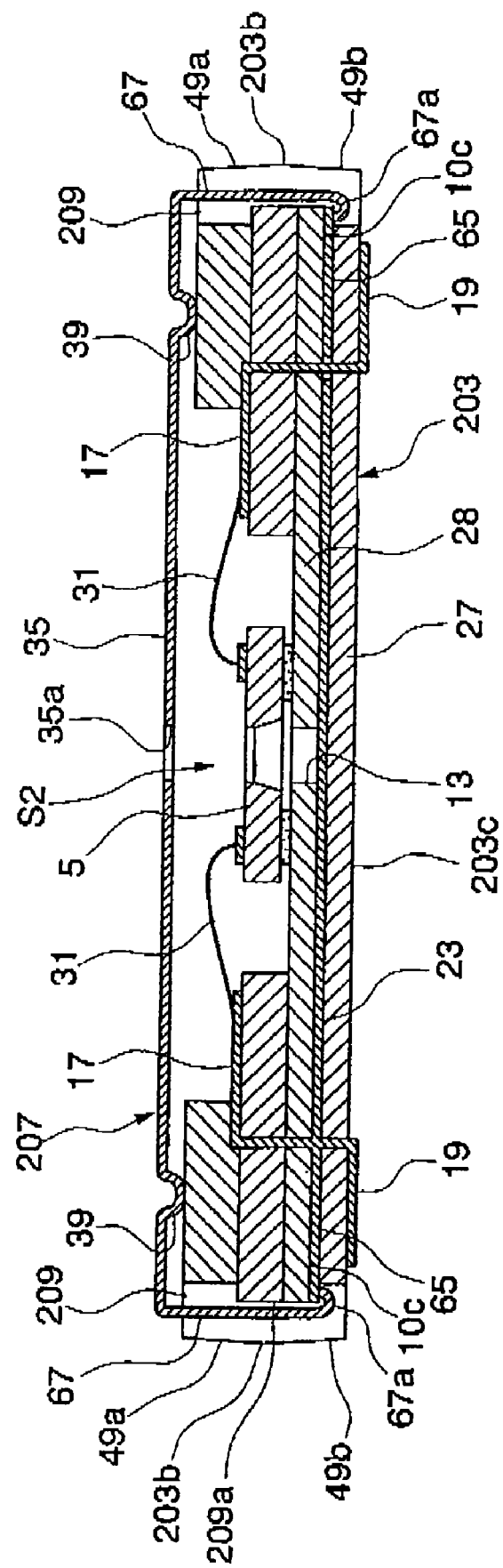
FIG. 29 is a sectional side view that shows a modified example of the semiconductor device according to the third embodiment of the present invention.

That is to say, as shown in FIG. 29 for example, a latching step section 10c similar to that in the above embodiment is formed between the insulating layer 27 that forms the reverse surface 203c of the ceramic substrate 203 and the second insulating layer 28 in which a hole 13 is formed. The shield member 23 is formed on the reverse surface of the second insulating layer 28. Part of this shield member 23 is exposed to the outside from the latching step section 10c, forming a terminal section 65. This terminal section 65 faces the same direction as the reverse surface 203 of the ceramic substrate 203.

Tip end sections (latching sections) 67a of a pair of side wall sections 67 respectively engage with the latching step section 10c and connect to the terminal section 65 The above tip end sections 67a may be engaged with the latching step section 10c and pressed against the terminal section 65 by pressing a roller against the lid 207 after it has been placed over the ceramic substrate 203 to deform it.

The terminal section 65 electrically connected to the side wall section 67 may be exposed to the outside from the side surface 203b of the ceramic substrate 203 for example. In this case, the side wall section 38 and the shield member 23 can be electrically connected to each other by pressing the latching sections 35b of the side wall sections 38 that pinch hold the ceramic substrate 203, into contact with the terminal section as described in the third embodiment.

Also in the case of these constructions, the electric potentials of the lid 207 and the shield member 23 are equal since the lid 207 and shield member 23 are electrically connected to each other. Accordingly, these conductive lid 207 and shield member 23 prevent electrical noise occurring outside of the semiconductor device 201 from entering into the hollow space S2 and reaching the semiconductor chip 5. In other words, a noise related malfunction of the semiconductor chip 5 can be reliably prevented.

In the construction of FIG. 29, the shield member 23 is connected to the semiconductor chip 5 via one pad electrode 17 and wire 31, and is further connected to one external connection terminal 19. This is connected to a power supply such as a voltage Vss of a mounting substrate (not shown in the diagram) on which this semiconductor device 71 is mounted. This configuration of the electrical connection between the shield member 23, the semiconductor chip 5 and the external connection terminal 19 may be applied to other embodiments described above.

Moreover, the latching step sections 10b and 10c were formed in the cutaway 209 of the ceramic substrate 203, however, it is not limited to this, and all that needs to be formed is a step section for inserting and hooking the latching sections formed in the side wall sections 38 and 67. In other words, in the cutaway 209, a concave section (step section) may be recessed into and formed in the side surface 209a. In this case, the latching section to be inserted into the above concave section is formed part way along the side wall sections 38 and 67.

Furthermore, in the third embodiment a large number of the lids 207 are formed However, a lid plate member in which a large number of the lids 207 are joined in the same arrangement as the concave sections 11 formed in the substrate plate member 41 may be used as with the second manufacturing method of the semiconductor device according to the first embodiment. That is to say, a joint section that joins the circumference of the top plate section 35 of each of the adjacent lids 207 is pre-formed in the above lid plate member. It is preferable that a breaking section that can be easily broken be preformed in this joint section. By forming this breaking section, an easy-deforming section of the lid plate member and the remaining sections of the cuts 49a and 49b formed in the substrate plate member 41 can be broken apart in the dividing step.

In the case where a semiconductor device is manufactured using a lid plate member as mentioned above, since the respective lids 7 can be easily positioned with respect to a large number of the semiconductor chips 5 in the overlapping step, and a large number of the semiconductor devices can be manufactured simply by breaking the substrate plate member 41 and the lid plate member simultaneously at the cuts 49a, 49b and the breaking section in the dividing step, manufacturing efficiency of the semiconductor device can be improved while achieving a reduction in manufacturing cost of the semiconductor device.

Furthermore, in the case of manufacturing the semiconductor 201, the substrate plate member 41 was used. However, it is not limited to this and the lids 207 may be respectively overlapped on the pre-divided individual ceramic substrates 203.

Even in the case of this configuration, the lid 207 can be fixed on the ceramic substrate 203 when overlapping the lid 207 on the ceramic substrate 203, by pinch holding the ceramic substrate 203 with a pair of the opposing side wall sections 38 and 67 or by inserting and hooking one portion of the side wall sections 38 and 67 with the latching step sections 10b and 10c of the ceramic substrate 203.

Furthermore, an example of forming the cutaway 209, which engages with the side wall sections 38 and 67, in the side surface 203b of the ceramic substrate 203 has been described. However, the side wall sections 33 and 67 need only to be arranged adjacent to the side surface 203b side of the ceramic substrate 203. Particularly, in the case of manufacturing the semiconductor device 201 without using a substrate plate member 41, that is, in the case of placing the lids 207 over the individual ceramic substrates 203, the above cutaway 209 does not need to be formed.

Figure 30:
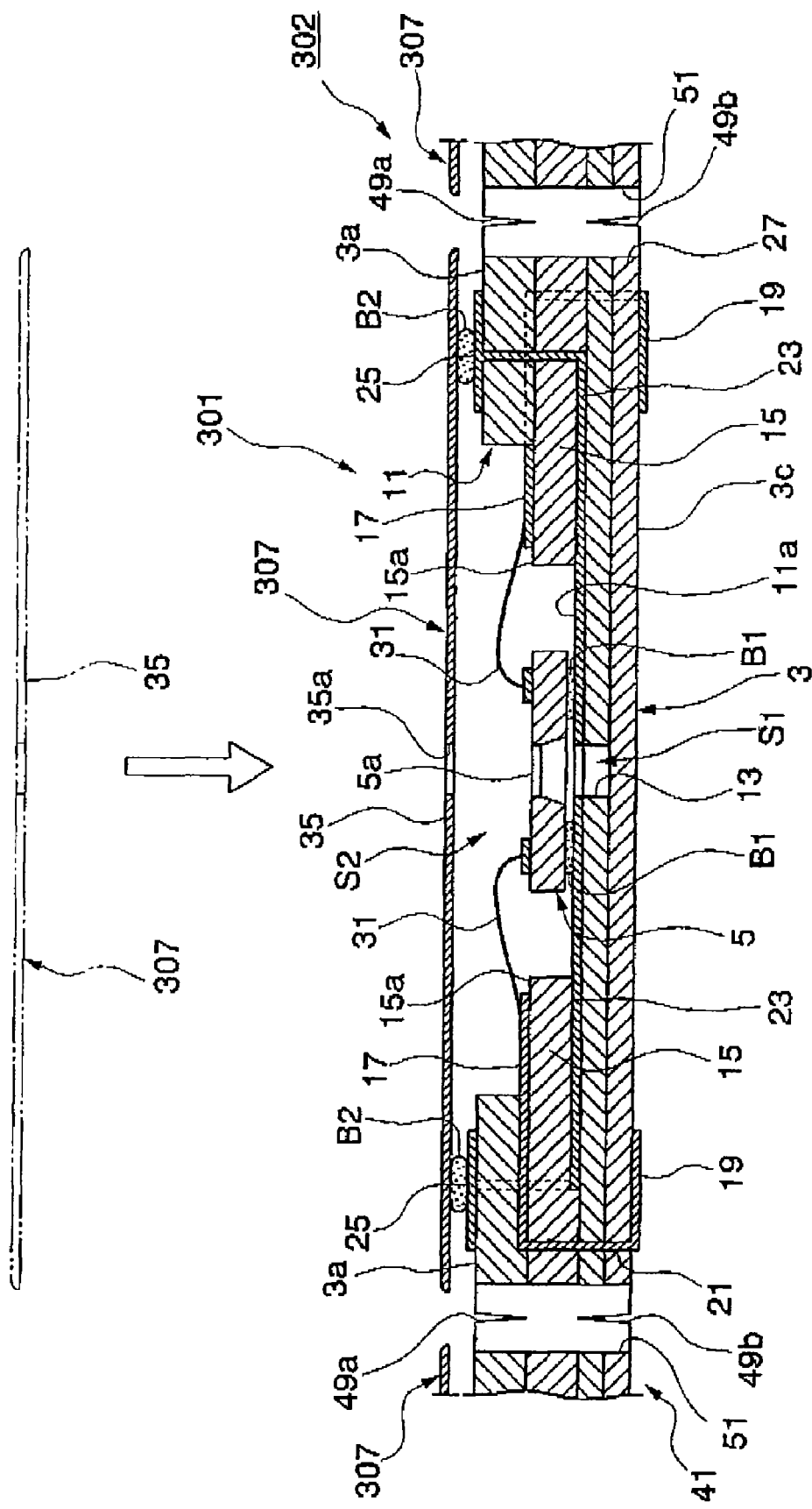
FIG. 30 is a sectional side view that shows a semiconductor device according to a fourth embodiment of the present invention.

Next is a description of a semiconductor device 301 according to a fourth embodiment of the present invention, with reference to FIG. 30. Components the same as for the aforementioned semiconductor device of the first embodiment of the present invention are denoted by the same reference numbers, and their description is omitted.

In this embodiment, similarly to semiconductor device of the first embodiment, the substrate plate member 41 is formed by the substrate plate member preparation step.

Next, as shown in FIG. 30, in this lid preparation step, a plurality of lids 307 comprising only a substantially plate-shaped top plate section 35 are individually prepared. This lid 307 is different from the semiconductor device of the first embodiment in the point that the substantially annular shaped projection section 39 and the side wall sections 37 are not formed on the top plate section 35. The lid 307 is formed from a material having conducting properties, for example nickel silver (Cu—Ni—Zn alloy), plated copper, plated 42 alloy (Fe-42 wt % Ni alloy) or the like. For the plating, for example nickel plating, chrome plating, or gold plating is applied.

In the case of this construction, in the overlapping step, the respective lids 307 are overlapped and fixed to the top surface 3a of the substrate plate member 41, so that the semiconductor chips 5 are covered by the lids 307. By performing this overlapping step, gives a construction of a semiconductor unit 302 where a large number of semiconductor chips 5 are individually covered by a large number of lids 307. The top plate section 35 and the connection pad 25 are adhered and fixed to each other by the conductive paste B2. As a result, the lid 307 is fixed to the ceramic substrate 3. Moreover, the lid 307 and the shield member 23 surround the semiconductor chip 5, and the shield member 23 of the ceramic substrate 3 and the lid 307 are electrically connected to each other.

By executing the dividing step on this semiconductor unit 302, for breaking the substrate plates 41 from the cutouts 49a and 49b, the individual piece semiconductor devices 301 are obtained.

Also in the case of manufacturing the semiconductor device 301 in the above manner, it is possible to improve the manufacturing efficiency of the semiconductor device 301, and reduce the manufacturing cost of the semiconductor device 301 Furthermore, since prior to the dividing step, the semiconductor device 301 is an integral single semiconductor unit 302, then by transporting the semiconductor unit 302 in this state, a large number of the semiconductor devices 301 can be easily transported.

As described above, in the case where a large number of individual lids 307 are formed in the lid preparation step, this is not limited to executing the dividing step using the roller L after the overlapping step, and for example the overlapping step may be executed after the dividing step.

In the semiconductor device of the first to fourth embodiments described above, a sound pressure sensor chip (microphone) was given as an example of the semiconductor chip 5. However, it is not limited to this, and the semiconductor chip 5 may be a pressure sensor chip for measuring pressure or pressure variation of the outer space of the semiconductor device 1 for example.

The embodiments of the present invention have been described in detail with reference to the drawings. However, specific constructions are not limited to these embodiments and modifications may be made to the design without departing from the scope of the present invention.

What is claimed is:

1. A manufacturing method for manufacturing a semiconductor device in which a semiconductor chip arranged on a substrate, is covered by a conducting lid, the method comprising:

substrate plate member preparation acts comprising
providing a substrate plate member having a plurality of said semiconductor chips arranged thereon,
forming dividing base lines for dividing said substrate plate member into individual substrates, and
forming insert holes in said substrate plate member at positions between adjacent individual substrates;

lid preparation acts comprising,
forming a number plurality of lids which individually cover said plurality of semiconductor chips, and forming side wall sections in each of said plurality of lids by bending a portion of each of said lids into an approximate U-shape to form bent sections which protrude in the thickness direction of said lid;

alignment acts comprising overlapping fixing said plurality of lids on said substrate plate member so that said plurality of lids respectively cover respective ones of said plurality of semiconductor chips, inserting said bent sections of respective lids into respective insert holes in said substrate plate member, and fixing said plurality of lids to said substrate plate member; and a dividing act of breaking said substrate plate member along said dividing base lines using a roller in order to obtain said semiconductor device.

2. The manufacturing method for a semiconductor device according to claim 1, wherein said lid preparation act further comprises forming an aperture section in each of said plurality of lids for communicating said semiconductor chips with the outside.

3. The manufacturing method for a semiconductor device according to claim 1, wherein said lid preparation act further comprises acts of forming a lid plate member having said plurality of lids connected together, wherein each of said plurality of lids are connected to adjacent lids at a connection section and forming breaking sections in said connecting sections that can be broken apart to separate adjacent lids;

said alignment act further comprises overlapping and fixing said lid plate member to one end face side of said substrate plate member so that said plurality of lids individually cover said plurality of semiconductor chips; and said dividing act further comprises breaking said breaking sections when breaking said substrate plate member.

4. The manufacturing method for a semiconductor device according to claim 1, wherein said dividing act further comprises pressing one side surface of said substrate plate member against a circumference surface of said roller formed in a substantially column shape.

5. The manufacturing method for a semiconductor device according to claim 1, wherein:

said substrate plate member preparation act further comprises forming on said substrate plate member, a conductive shield member which underlies said plurality of semiconductor chips; and said overlapping act further comprises electrically connecting each of said lids and said shield member.

6. The manufacturing method for a semiconductor device according to claim 1, wherein said substrate plate member preparation act further comprises:

forming in a plurality of layers, a green sheet formed by forming a paste containing ceramic powder in sheet form and forming a printed circuit on a surface;

forming said dividing base lines in said green sheet laminated body; and forming said substrate plate member by baking said green sheet laminated body.

7. The manufacturing method for a semiconductor device according to claim 1, wherein:

said substrate plate member preparation act further comprises forming said insert holes at an edge of each individual substrate; and said alignment act further comprises after inserting said protruding side wall sections into said insert holes, latching a portion of said protruding side wall sections with said individual substrates.

8. The manufacturing method for a semiconductor device according to claim 1, wherein:

said substrate plate member preparation act further comprises: forming a cutout in said dividing base lines, and said dividing act further comprises breaking said substrate plate member from said cutout.

9. The manufacturing method for a semiconductor device according to claim 1, wherein said plurality of semiconductor chips are sound pressure sensors.

10. A method for manufacturing a plurality of semiconductor devices comprising:

providing a substrate plate member having a plurality of said semiconductor chips arranged thereon;

forming cutouts in said substrate plate member for dividing said substrate plate member into individual substrates having individual semiconductor chips arranged thereon;

forming insert holes in said substrate plate member at positions between adjacent individual substrates;

forming a plurality of lids, each of said plurality of lids having side wall sections that are bent into an approximate U-shape to form bent sections which project in a thickness direction of said lid;

aligning said plurality of lids to respectively cover respective ones of said plurality of semiconductor chips;

inserting bent sections of respective lids into respective insert holes in said substrate plate member; and breaking said substrate plate member along said cutouts using a roller in order to obtain said plurality of semiconductor devices.

11. A manufacturing method for manufacturing a semiconductor device in which a semiconductor chip arranged on a substrate, is covered by a conducting lid, the method comprising:

substrate plate member preparation acts comprising providing a substrate plate member having a plurality of said semiconductor chips arranged thereon, forming dividing base lines for dividing said substrate plate member into individual substrates, and forming insert holes in part of said dividing base lines at positions between adjacent individual substrates;

lid preparation acts comprising forming a plurality of lids which individually cover said plurality of semiconductor chips forming a lid plate member having said plurality of lids connected together, wherein each of said plurality of lids are connected to adjacent lids at a connection section, and forming breaking sections in said connecting sections that can be broken apart to separate adjacent lids, bending said connecting sections of said lid plate member for inserting into said insert holes, into an approximate U-shape, to form bent sections which protrude in the thickness direction of said lid plate member, and forming said breaking sections in tip end portions of said bent sections;

alignment acts comprising overlapping said plurality of lids on said substrate plate member so that said plurality of lids respectively cover respective ones of said semiconductor chips, inserting said bent sections into said insert holes, and fixing said plurality of lids to one end face side of said substrate plate member; and dividing acts comprising breaking said substrate plate member along said dividing base lines and breaking said breaking sections in order to obtain said semiconductor device.

* * * * *

UNITED STATES PATENT AND TRADEMARK OFFICE
CERTIFICATE OF CORRECTION

PATENT NO. : 7,646,092 B2
APPLICATION NO. : 11/566879
DATED : January 12, 2010
INVENTOR(S) : Saitoh et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 299 days.

Signed and Sealed this

Twenty-eighth Day of December, 2010

David J. Kappos
*Director of the United States Patent and Trademark Office*